(12) United States Patent
Song et al.

(10) Patent No.: US 9,224,969 B2
(45) Date of Patent: *Dec. 29, 2015

(54) ORGANIC LIGHT-EMITTING DIODE AND FLAT DISPLAY DEVICE INCLUDING THE SAME

(75) Inventors: Won-Jun Song, Yongin (KR); Mie-Hwa Park, Yongin (KR); Kwan-Hee Lee, Yongin (KR); Sam-Il Kho, Yongin (KR); Sun-Hee Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 681 days.

This patent is subject to a terminal disclaimer.

(21) Appl. No.: 13/471,115

(22) Filed: May 14, 2012

(65) Prior Publication Data

US 2012/0326137 A1 Dec. 27, 2012

(30) Foreign Application Priority Data

Jun. 17, 2011 (KR) .......................... 10-2011-0059170

(51) Int. Cl.
*H01L 51/54* (2006.01)
*H01L 51/50* (2006.01)
*H01L 51/00* (2006.01)

(52) U.S. Cl.
CPC .......... *H01L 51/5064* (2013.01); *H01L 51/506* (2013.01); *H01L 51/5008* (2013.01);
(Continued)

(58) Field of Classification Search
CPC ............ H01L 51/0051; H01L 51/0054; H01L 51/006; H01L 51/0061; H01L 51/5008; H01L 51/506; H01L 51/5064
USPC ............................ 428/690, 917; 313/504, 506
See application file for complete search history.

(56) References Cited

U.S. PATENT DOCUMENTS 6,565,996 B2 5/2003 Hatwar et al.
9,006,721 B2 4/2015 Lee et al.
(Continued)

FOREIGN PATENT DOCUMENTS

JP 2005-166641 6/2005
KR 10-2005-0054427 6/2005
(Continued)

OTHER PUBLICATIONS

U.S. Notice of Allowance dated Jul. 15, 2015, for cross reference U.S. Appl. No. 13/467,960, (8 pages).

*Primary Examiner* — Dawin Garrett
(74) *Attorney, Agent, or Firm* — Christie, Parker & Hale, LLP

(57) ABSTRACT

An organic light-emitting diode including a first electrode; a second electrode facing the first electrode; an emission layer interposed between the first electrode and the second electrode; a first hole transport layer including a first hole transporting compound; a second hole transport layer including a second hole transporting compound, the first and second hole transport layers being interposed between the first electrode and the emission layer; an electron transport layer interposed between the emission layer and the second electrode; a first mixing layer interposed between the first electrode and the first hole transport layer, contacting the first hole transport layer, and including the first hole transporting compound and a first cyano group-containing compound; and a second mixing layer interposed between the first electrode and the second hole transport layer, contacting the second hole transport layer, and including the second hole transporting compound and a second cyano group-containing compound.

20 Claims, 2 Drawing Sheets

(52) U.S. Cl.
CPC .......... *H01L51/006* (2013.01); *H01L 51/0051* (2013.01); *H01L 51/0054* (2013.01); *H01L 51/0061* (2013.01)

(56) References Cited

U.S. PATENT DOCUMENTS

| | | | |
|---|---|---|---|
| 2003/0048072 A1* | 3/2003 | Ishihara et al. | 313/506 |
| 2005/0106419 A1 | 5/2005 | Endoh et al. | |
| 2005/0121667 A1 | 6/2005 | Kuehl et al. | |
| 2005/0221124 A1 | 10/2005 | Hwang et al. | |
| 2006/0188745 A1* | 8/2006 | Liao et al. | 428/690 |
| 2006/0240277 A1* | 10/2006 | Hatwar et al. | 428/690 |
| 2007/0141396 A1 | 6/2007 | Chun et al. | |
| 2008/0014464 A1* | 1/2008 | Kawamura et al. | 428/690 |
| 2009/0167161 A1 | 7/2009 | Yabunouchi et al. | |
| 2009/0218933 A1* | 9/2009 | Matsushima et al. | 313/504 |
| 2010/0109000 A1 | 5/2010 | Mathai et al. | |
| 2010/0219404 A1* | 9/2010 | Endo et al. | 257/40 |
| 2011/0084258 A1 | 4/2011 | Kim et al. | |
| 2011/0193074 A1 | 8/2011 | Lee et al. | |
| 2011/0233525 A1 | 9/2011 | Terao et al. | |
| 2011/0248251 A1* | 10/2011 | Yamamoto et al. | 257/40 |
| 2013/0032788 A1* | 2/2013 | Lee et al. | 257/40 |
| 2013/0140530 A1* | 6/2013 | Kho et al. | 257/40 |
| 2013/0153865 A1* | 6/2013 | Kho et al. | 257/40 |
| 2014/0246663 A1* | 9/2014 | Kambe et al. | 257/40 |

FOREIGN PATENT DOCUMENTS

| | | |
|---|---|---|
| KR | 10-2005-0097670 | 10/2005 |
| KR | 10-2007-0068147 | 6/2007 |
| KR | 10-2009-0098930 A | 9/2009 |
| KR | 10-2010-0039815 | 4/2010 |
| KR | 10-2010-0043994 A | 4/2010 |
| KR | 10-2010-0068617 A | 6/2010 |
| KR | 10-2010-0094819 | 8/2010 |
| KR | 10-2010-0095504 | 8/2010 |
| KR | 10-2010-0097180 | 9/2010 |
| KR | 10-2011-0039812 A | 4/2011 |
| KR | 10-2011-0089142 | 8/2011 |
| WO | WO 2009/069434 | 6/2009 |

* cited by examiner

ORGANIC LIGHT-EMITTING DIODE AND FLAT DISPLAY DEVICE INCLUDING THE SAME

CROSS-REFERENCE TO RELATED PATENT APPLICATION

This application claims priority to and the benefit of Korean Patent Application No. 10-2011-0059170, filed on Jun. 17, 2011, in the Korean Intellectual Property Office, the disclosure of which is incorporated herein in its entirety by reference.

BACKGROUND

1. Field

The following description relates to an organic light-emitting diode and a flat display device including the same, and more particularly, to an organic light-emitting diode including a multi-layered hole transport layer, wherein the multi-layered hole transport layer is doped with a cyano group-containing compound and a flat display device including the same.

2. Description of Related Art

Organic light-emitting diodes (OLEDs), which are self-emitting devices, have advantages such as a wide viewing angle, excellent contrast, quick response, high brightness, and excellent driving voltage characteristics, and can provide multicolored images.

A general OLED has a structure that includes a substrate, and further includes an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

An OLED has not had fully satisfactory characteristics in terms of luminance, efficiency, driving stability, lifetime, and the like, and thus there is an urgent need for development of various improvement technologies. For example, there is a need to develop an OLED having high driving voltage and long lifetime.

SUMMARY

Aspects of embodiment of the present invention are directed toward an organic light-emitting diode in which the structure and material of a hole transport layer are changed to reduce an interface resistance between an electrode and an organic layer, increase the number of free holes of the hole transport layer and reduce a bulk resistance of the hole transport layer, whereby the organic light-emitting diode has enhanced performances, and a flat display device including the same.

According to an embodiment of the present invention, there is provided an organic light-emitting diode including: a first electrode; a second electrode facing the first electrode; an emission layer interposed between the first electrode and the second electrode; a first hole transport layer including a first hole transporting compound; a second hole transport layer including a second hole transporting compound, the first hole transport layer and the second hole transport layer being interposed between the first electrode and the emission layer; an electron transport layer interposed between the emission layer and the second electrode; a first mixing layer interposed between the first electrode and the first hole transport layer, contacting the first hole transport layer, and including the first hole transporting compound and a first cyano group-containing compound; and a second mixing layer interposed between the first electrode and the second hole transport layer, contacting the second hole transport layer, and including the second hole transporting compound and a second cyano group-containing compound.

A detailed description of the first cyano group-containing compound and the second cyano group-containing compound will be provided later.

A detailed description of the first hole transporting compound and the second hole transporting compound will be provided later.

An amount of the first cyano group-containing compound in the first mixing layer may be in the range of about 0.5 to about 10 parts by weight based on 100 parts by weight of the first mixing layer, and an amount of the second cyano group-containing compound in the second mixing layer may be in the range of about 0.5 to about 10 parts by weight based on 100 parts by weight of the second mixing layer.

A thickness of each of the first mixing layer and the second mixing layer may be independently in the range of about 50 to about 200 Å.

The second hole transport layer may be interposed between the emission layer and the first hole transport layer and have a higher lowest unoccupied molecular orbital potential than that of the first hole transport layer.

The first mixing layer may contact the first electrode.

The organic light-emitting diode may further include a third hole transport layer interposed between the first electrode and the emission layer and including a third hole transporting compound; and a third mixing layer interposed between the first electrode and the third hole transport layer, contacting the third hole transport layer, and including the third hole transporting compound and a third cyano group-containing compound.

The organic light-emitting diode may further include at least one of an electron blocking layer interposed between the emission layer and the second hole transport layer or a hole blocking layer interposed between the emission layer and the electron transport layer.

The organic light-emitting diode may be a top-emission type organic light-emitting diode further including a passivation layer on the second electrode.

According to another embodiment of the present invention, there is provided a flat display device including: a transistor including a source electrode, a drain electrode, a gate, and an active layer; and the organic light-emitting diode described above, wherein the source electrode or the drain electrode is electrically connected to the first electrode of the organic light-emitting diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

One or more embodiments of the present invention will now be described in detail with reference to the accompanying drawings.

Figure 1:
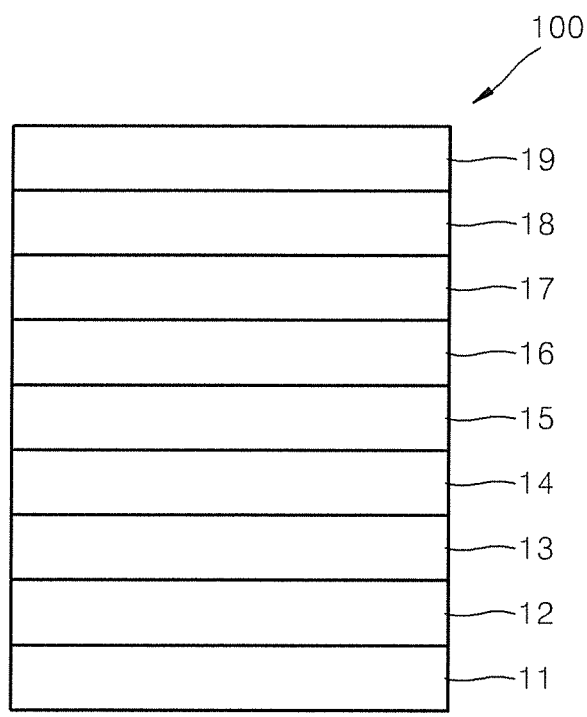
FIG. 1 is a schematic diagram illustrating a structure of a bottom-emission type organic light-emitting diode according to an embodiment.

FIG. 1 is a schematic diagram illustrating a structure of a bottom-emission type organic light-emitting diode 100 according to an embodiment.

The organic light-emitting diode 100 includes: a first electrode 11; a second electrode 19 facing the first electrode 11; an emission layer 16 interposed between the first electrode 11 and the second electrode 19; a first hole transport layer 13 including a first hole transporting compound; a second hole transport layer 15 including a second hole transporting compound, the first hole transport layer and the second hole transport layer being interposed between the first electrode 11 and the emission layer 16; an electron transport layer 17 interposed between the emission layer 16 and the second electrode 19; a first mixing layer 12 interposed between the first electrode 11 and the first hole transport layer 13, contacting the first hole transport layer 13 and including the first hole transporting compound and a first cyano group-containing compound; and a second mixing layer 14 interposed between the first electrode 11 and the second hole transport layer 15, contacting the second hole transport layer 15 and including the second hole transporting compound and a second cyano group-containing compound.

The organic light-emitting diode 100 includes a plurality of hole transport layers, i.e., the first hole transport layer 13 and the second hole transport layer 15, and the first mixing layer 12 and the second mixing layer 14 respectively contacting the first hole transport layer 13 and the second hole transport layer 15. Since the organic light-emitting diode 100 includes a plurality of hole transport layers, i.e., the first hole transport layer 13 and the second hole transport layer 15, a charge balance in the emission layer 16 is obtained, which results in enhanced lifetime of the organic light-emitting diode.

In the case where an organic light-emitting diode does not include a hole injection layer and includes a single-layered hole transport layer, the driving voltage of the organic light-emitting diode increases when a material with bad hole injection properties is used to form the hole transport layer. On the other hand, when a material with excellent hole injection properties is used to form the hole transport layer, holes are excessively injected into the hole transport layer, and thus the driving voltage of the organic light-emitting diode decreases, but the efficiency or lifetime of the organic light-emitting diode also decreases. In contrast, the organic light-emitting diode 100 includes the plurality of hole transport layers, and thus the driving voltage of the organic light-emitting diode may decrease and the lifetime of the organic light-emitting diode may increase. For example, when the first hole transport layer 13 and the second hole transport layer 15 are respectively formed of a material with excellent hole injection properties and/or stable electrical properties, the hole transport properties of the hole transport layer may increase and non-light emission quenching may decrease.

The organic light-emitting diode 100 includes the first mixing layer 12 including the first hole transporting compound and a first cyano group-containing compound, and the second mixing layer 14 including the second hole transporting compound and a second cyano group-containing compound, and thus the hole injection properties are more enhanced. The first and second cyano group-containing compounds are used to form layers respectively contacting the first hole transport layer 13 and the second hole transport layer 15, thereby inducing a reduction reaction. Accordingly, the hole injection properties of the first electrode is enhanced, and the amount of free holes of the first and second hole transport layers 13 and 15 increases.

The first cyano group-containing compound and the second cyano group-containing compound may be each independently represented by one of Formulae 1 through 20 below:

Formula 1

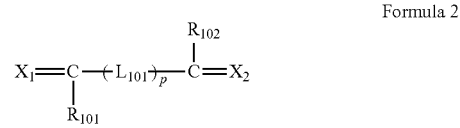

Formula 2

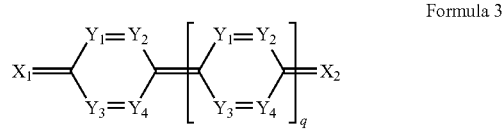

Formula 3

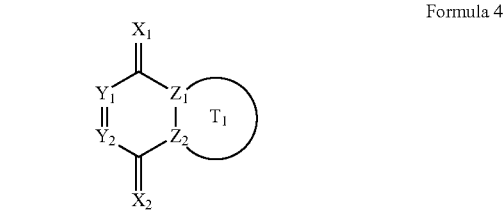

Formula 4

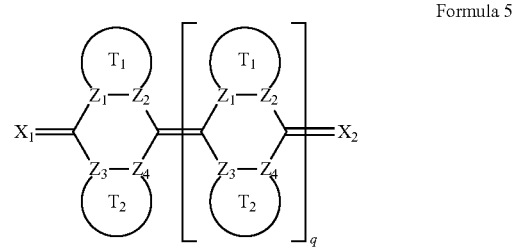

Formula 5

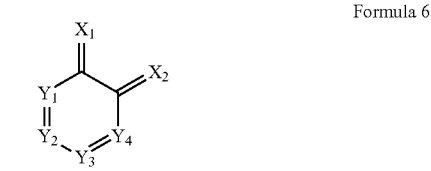

Formula 6

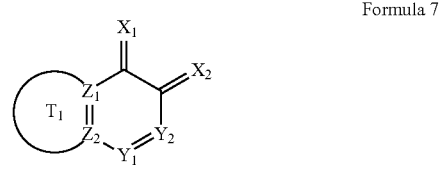

Formula 7

Formula 8
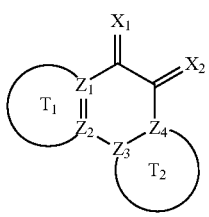

Formula 9
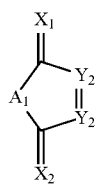

Formula 10
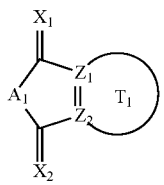

Formula 11
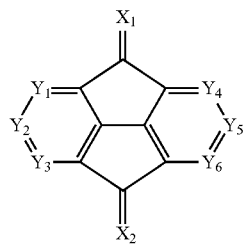

Formula 12
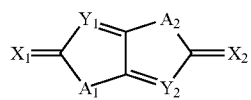

Formula 13
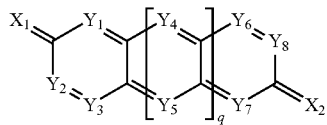

Formula 14
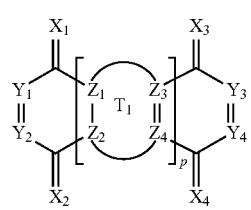

Formula 15
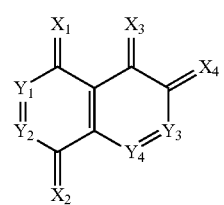

Formula 16
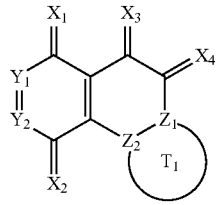

Formula 17
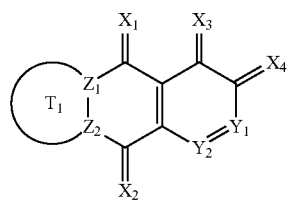

Formula 18
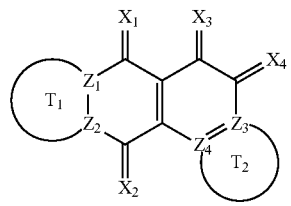

Formula 19
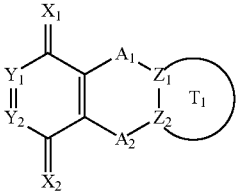

Formula 20
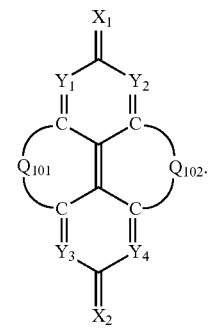

In Formulae 1 through 20, $X_1$, $X_2$, $X_3$, and $X_4$ are each independently one of

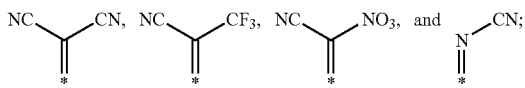

each of $Y_1$ through $Y_8$ is independently N or $CR_{103}$; each of $Z_1$, $Z_2$, $Z_3$, and $Z_4$ is independently CH or N; $A_1$ and $A_2$ are each independently one of O, S, $NR_{104}$, and $C(R_{105})(R_{106})$; $L_{101}$ is a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group; each of $Q_{101}$ and $Q_{102}$ is independently a substituted or unsubstituted $C_1$-$C_{30}$ alkylene group or a substituted or unsubstituted $C_2$-$C_{30}$ alkenylene group; each of $T_1$ and $T_2$ is independently a substituted or unsubstituted $C_5$-$C_{30}$ aromatic ring system or a substituted or unsubstituted $C_3$-$C_{30}$ heteroaromatic ring system; each of $R_{101}$, $R_{102}$, $R_{103}$, $R_{104}$, $R_{105}$, and $R_{106}$ is independently one of a hydrogen atom, a deuterium atom, a halogen atom, a hydroxyl group, a cyano group, a nitro group, a carboxyl group,

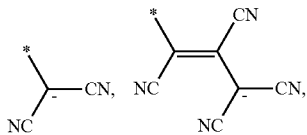

a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, and $N(R_{107})(R_{108})$; each of $R_{107}$ and $R_{108}$ is independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_5$-$C_{30}$ aryl group, or a substituted or unsubstituted $C_3$-$C_{30}$ heteroaryl group; p is an integer of 1 to 10; and q is an integer of 0 to 10.

For example, each of $X_1$, $X_2$, $X_3$, and $X_4$ may be independently

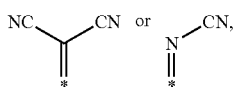

and include a cyano group.

For example, $L_{101}$ may be a substituted or unsubstituted thiophenylene group or a substituted or unsubstituted benzothiophenylene group.

For example, each of $T_1$ and $T_2$ may be independently a substituted or unsubstituted benzene, a substituted or unsubstituted naphthalene, a substituted or unsubstituted anthracene, a substituted or unsubstituted thiophene, a substituted or unsubstituted thiadiazole, or a substituted or unsubstituted oxadiazole.

In the formulae above, $R_{103}$ exists when each of $Y_1$ through $Y_8$ is independently $CR_{103}$. For example, $R_{103}$ may be a hydrogen atom, a halogen atom, a cyano group, a substituted or unsubstituted $C_1$-$C_{10}$ alkyl group, a substituted or unsubstituted $C_1$-$C_{30}$ alkoxy group, or $N(R_{107})(R_{108})$. Each of $R_{107}$ and $R_{108}$ may be independently a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, or a substituted or unsubstituted methylnaphthyl group.

In particular, the first cyano group-containing compound and the second cyano group-containing compound may be each independently represented by one of Formulae 1A through 20B below:

Formula 1A
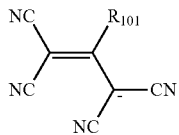

Formula 1B
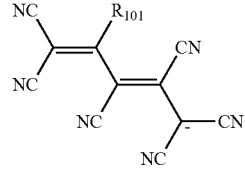

Formula 2A
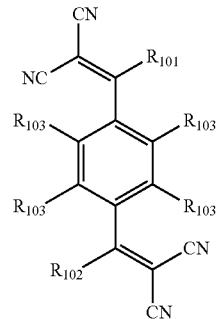

Formula 2B
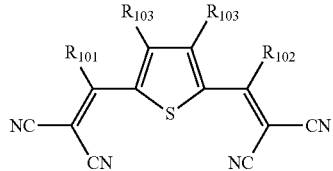

Formula 2C
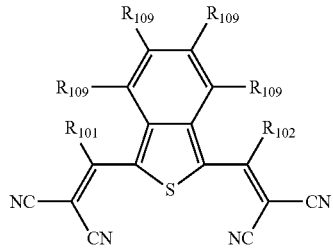

Formula 3A
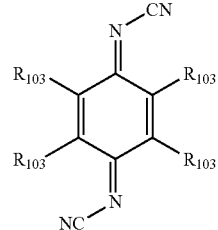

Formula 3B
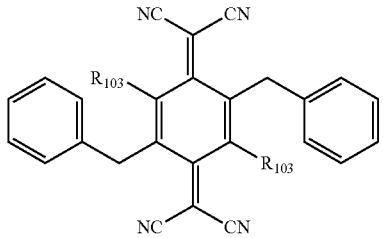

Formula 3C
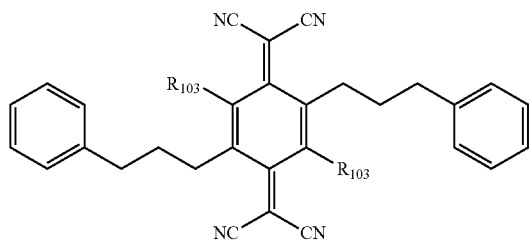
Formula 3D
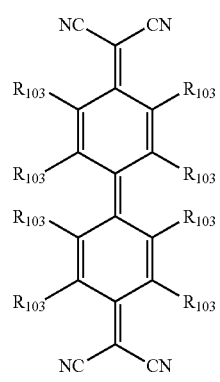
Formula 4A
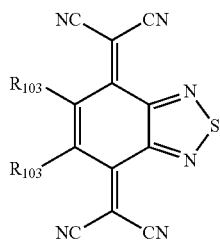
Formula 4B
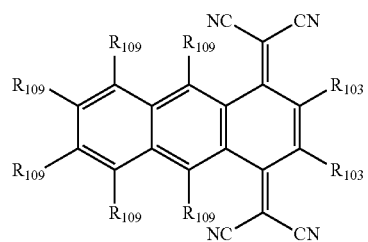
Formula 5A
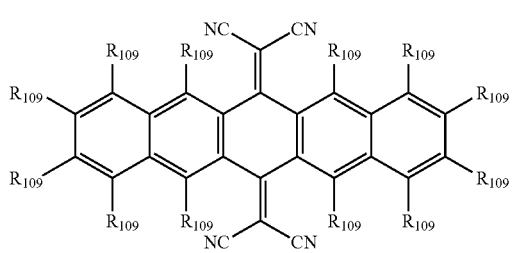
Formula 5B
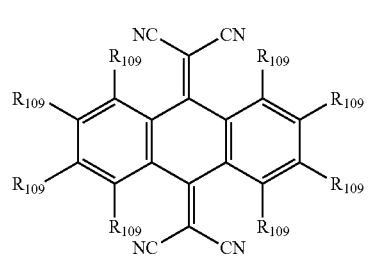
Formula 5C
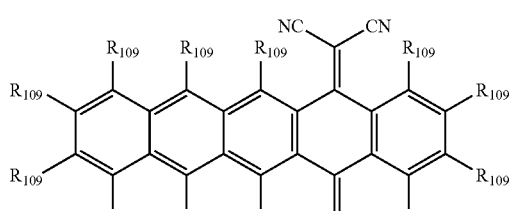
Formula 5D
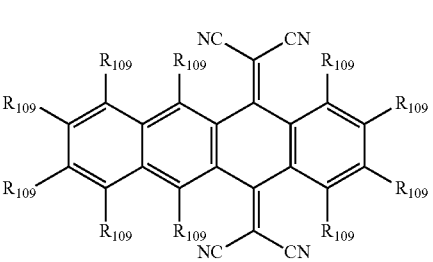
Formula 5E
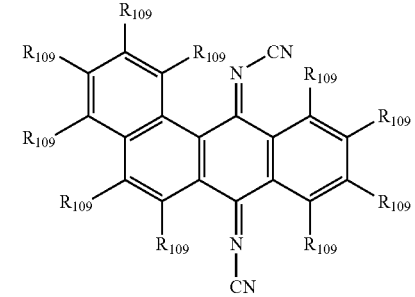
Formula 5F
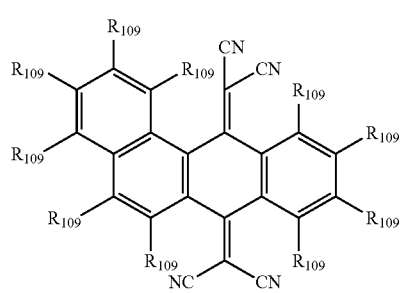
Formula 5G
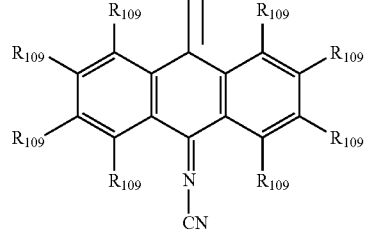

-continued
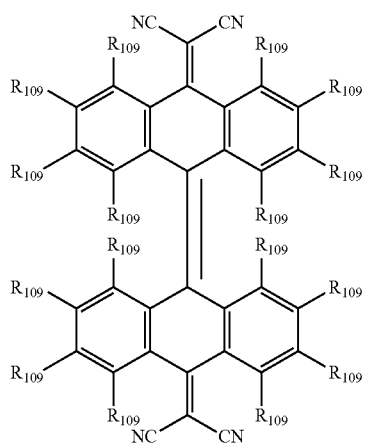
Formula 5H
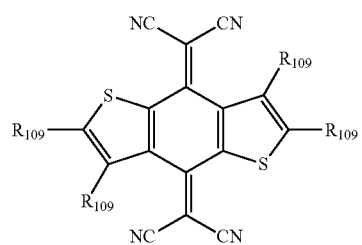
Formula 5I
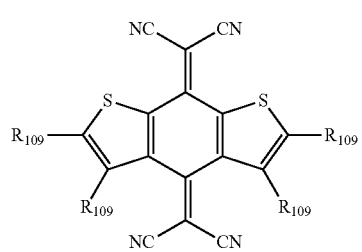
Formula 5J
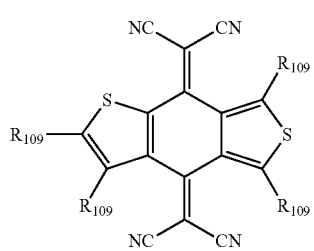
Formula 5K
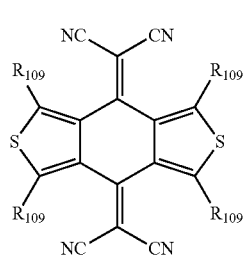
Formula 5L
-continued
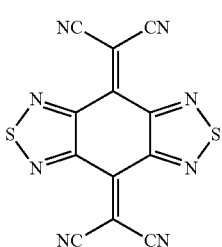
Formula 5M
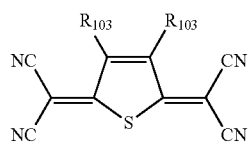
Formula 9A
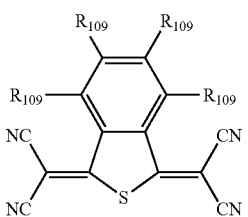
Formula 10A
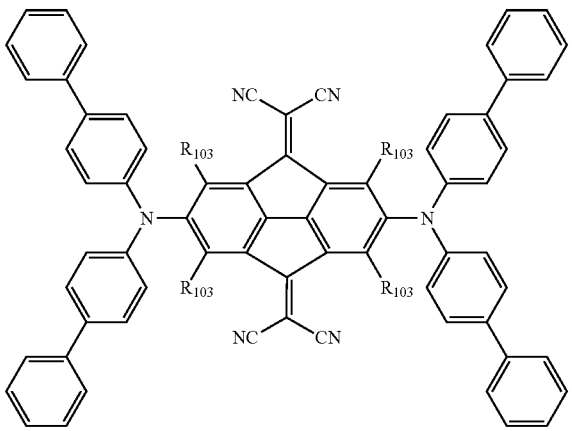
Formula 11A
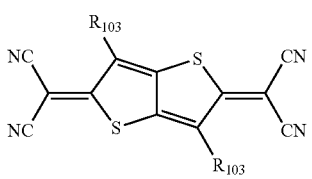
Formula 12A
Formula 12B -continued

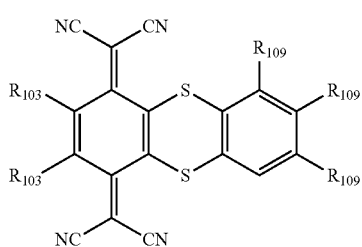

Formula 19A

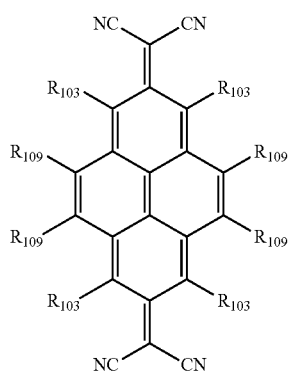

Formula 20A

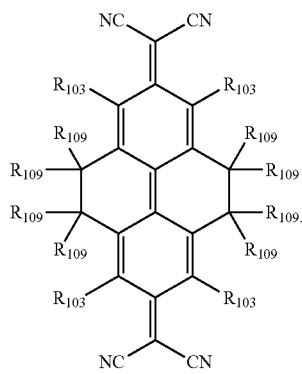

Formula 20B

In the above formulae, each of $R_{103}$ and $R_{109}$ may be independently a hydrogen atom, a fluorine atom, a cyano group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted methoxy group, a substituted or unsubstituted ethoxy group, or a substituted or unsubstituted propoxy group.

The first cyano group-containing compound included in the first mixing layer 12 may be the same as the second cyano-containing compound included in the second mixing layer 14. In this case, a process of forming the first mixing layer 12 and the second mixing layer 14 may be more economically performed. Even when the first cyano group-containing compound is the same as the second cyano group-containing compound, the amounts of the first and second cyano group-containing compounds included in the first mixing layer 12 and the second mixing layer 14 may be adjusted differently from each other.

For example, the first cyano group-containing compound and the second cyano group-containing compound may be each independently F4-TCNQ or TCNQ. Alternatively, each of the first cyano group-containing compound and the second cyano group-containing compound may be TCNQ.

The first hole transporting compound and the second hole transporting compound may be each independently represented by Formula 101 or 102 below:

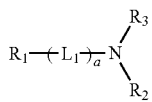

Formula 101

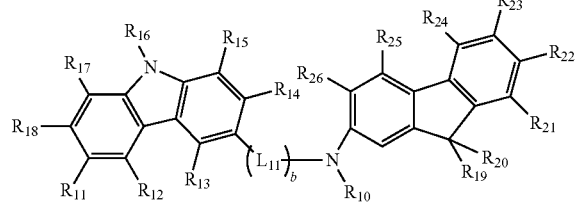

Formula 102 wherein $R_{10}$ is $-(Ar_1)_n-Ar_2$; $R_{11}$ is $-(Ar_{11})_m-Ar_{12}$; $L_1$, $L_{11}$, $Ar_1$, and $Ar_{11}$ are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, or $-N(Q_1)-$; $R_1$ through $R_3$, $R_{12}$ through $R_{26}$, $Ar_2$, $Ar_{12}$, and $Q_1$ are each independently a hydrogen atom, a deuterium atom, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_3$-$C_{30}$ heteroaryl group, or a group represented by $-N(Q_2)(Q_3)$; $Q_2$ and $Q_3$ are each independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, or a substituted or unsubstituted $C_3$-$C_{30}$ heteroaryl group; a, b, m, and n are each independently an integer of 0 to 10; however, n $Ar_1$ groups in $-(Ar_1)_n-$ may be the same as or different from each other, m $Ar_{11}$ groups in $-(Ar_{11})_m-$ may be the same as or different from each other, a $L_1$ groups in $-(L_1)_a-$ may be the same as or different from each other, and b $L_{11}$ groups in $-(L_{11})_b-$ may be the same as or different from each other.

For example, $Ar_1$ and $Ar_{11}$ may be each independently a $C_1$-$C_{10}$ alkylene group, a substituted or unsubstituted phenylene group, a substituted or unsubstituted indenylene group, a substituted or unsubstituted naphthylene group, a substituted or unsubstituted fluorenylene group, a substituted or unsubstituted anthrylene group, a substituted or unsubstituted carbazolylene group, a substituted or unsubstituted pyrazolylene group, a substituted or unsubstituted pyridynylene group, a substituted or unsubstituted triazinylene group or —N($Q_1$)-. $Q_1$ may be a hydrogen atom, a substituted or unsubstituted $C_1$-$C_{10}$ alkyl group, a substituted or unsubstituted $C_1$-$C_{10}$ alkoxy group, a substituted or unsubstituted phenyl group, a substituted or unsubstituted naphthyl group, a substituted or unsubstituted carbazolyl group, or a substituted or unsubstituted fluorenyl group.

For example, $Ar_2$ and $Ar_{12}$ may be each independently a hydrogen atom, a substituted or unsubstituted $C_1$-$C_{10}$ alkyl group, a substituted or unsubstituted phenyl group, a substituted or unsubstituted naphthyl group, a substituted or unsubstituted carbazolyl group, a substituted or unsubstituted fluorenyl group, a substituted or unsubstituted pyrenyl group, or a group represented by —N($Q_2$)($Q_3$). $Q_2$ and $Q_3$ may be each independently a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, or a substituted or unsubstituted methylnaphthyl group.

In particular, the first hole transporting compound and the second hole transporting compound may be each independently one of Compounds 101 through 137 below:

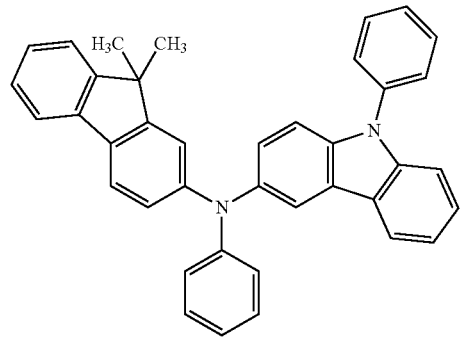

Compound 101

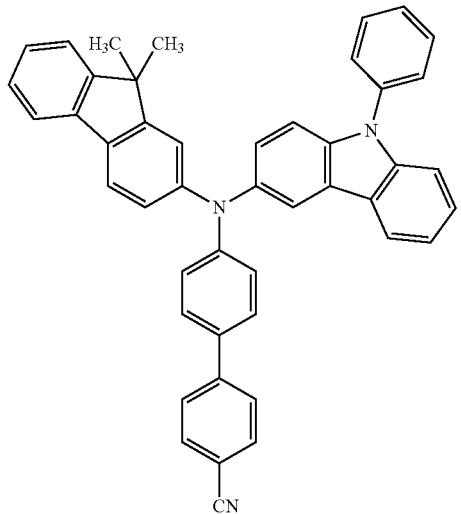

Compound 102

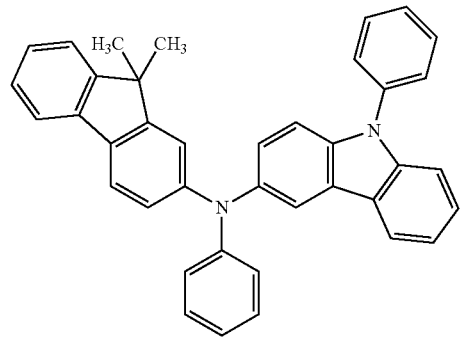

Compound 103

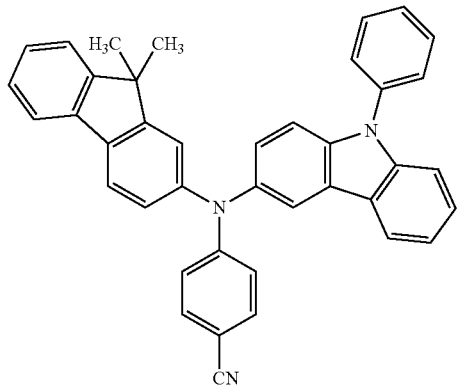

Compound 104

-continued
Compound 105
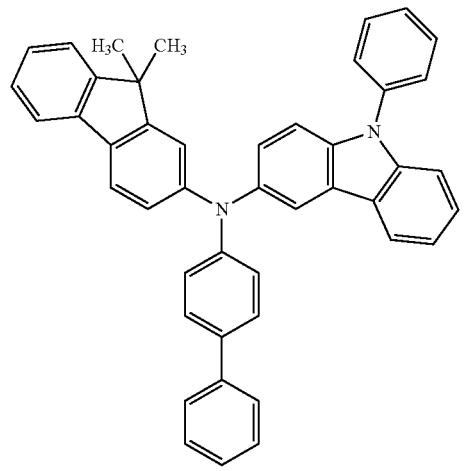
Compound 106
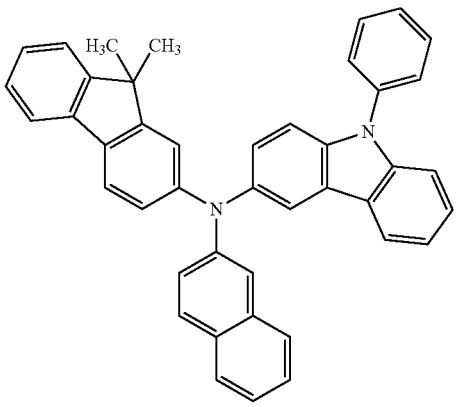
Compound 107
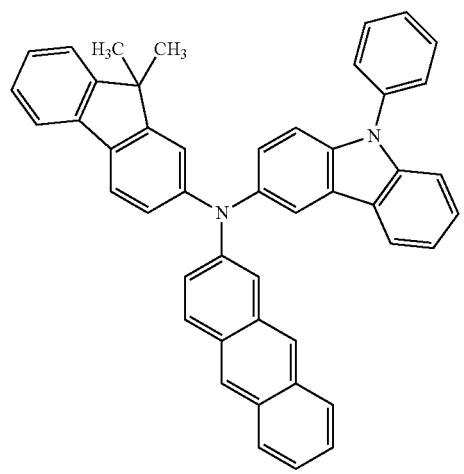
Compound 108
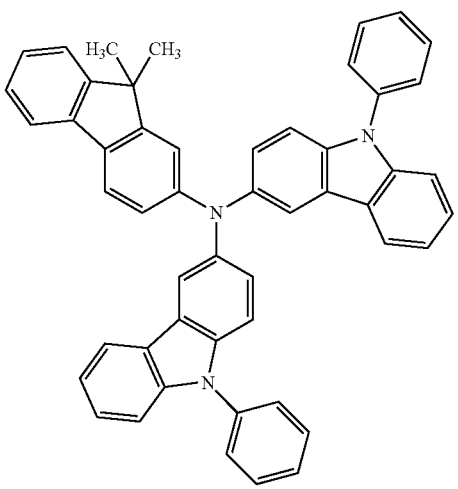
Compound 109
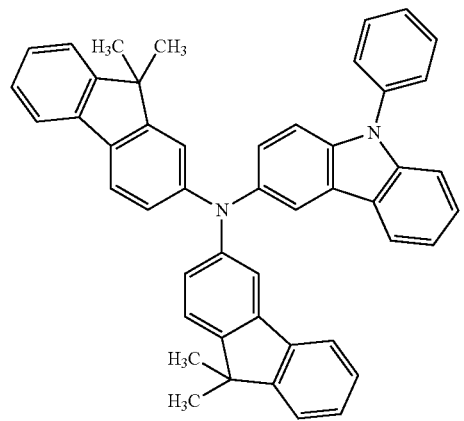
Compound 110
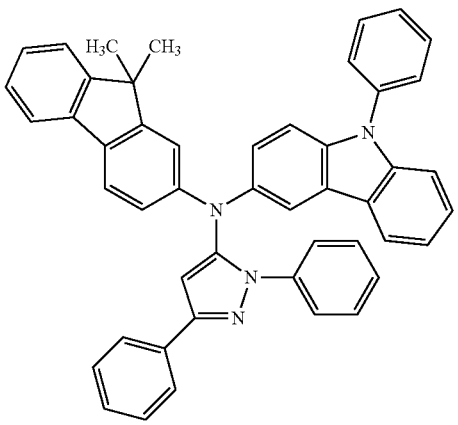

-continued
Compound 111
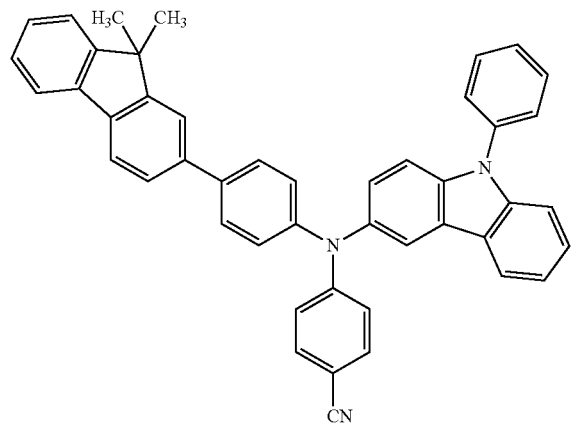
Compound 112
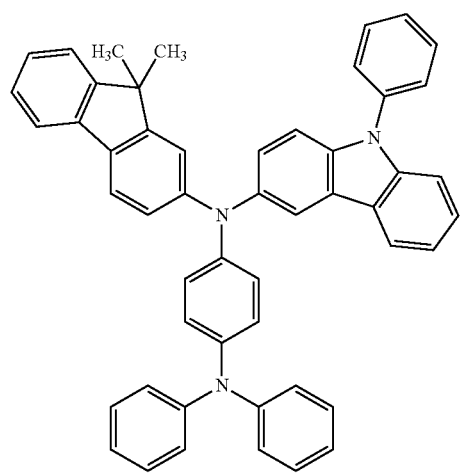
Compound 113
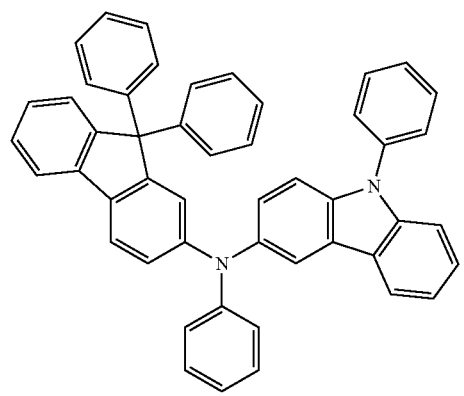

-continued
Compound 114
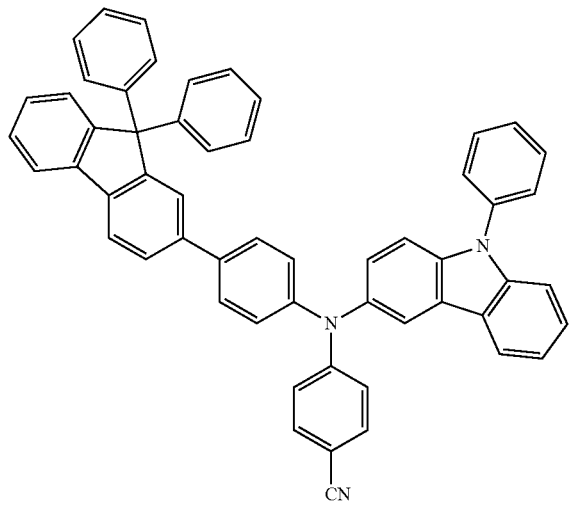
Compound 115
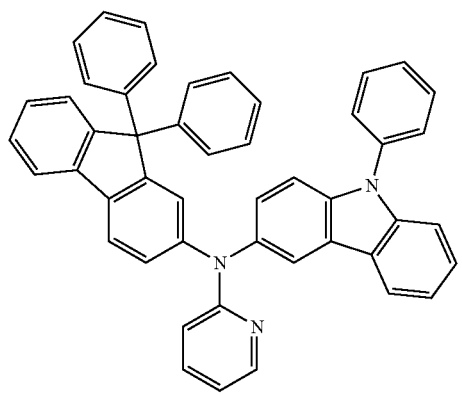
Compound 116
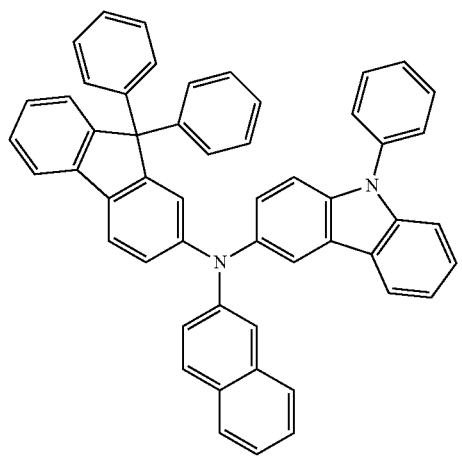

Compound 117
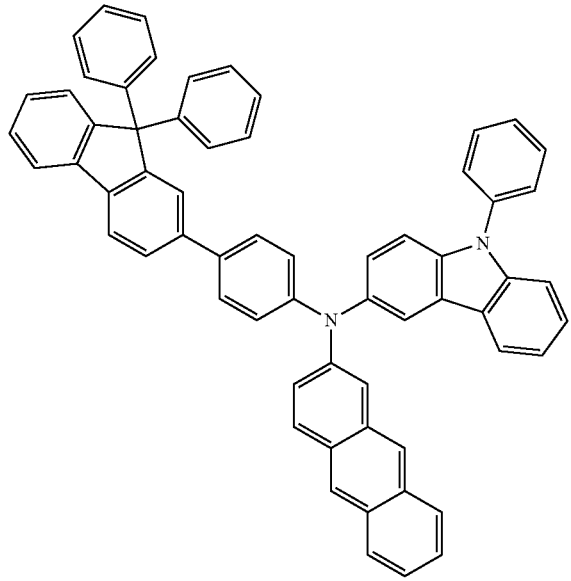
Compound 118
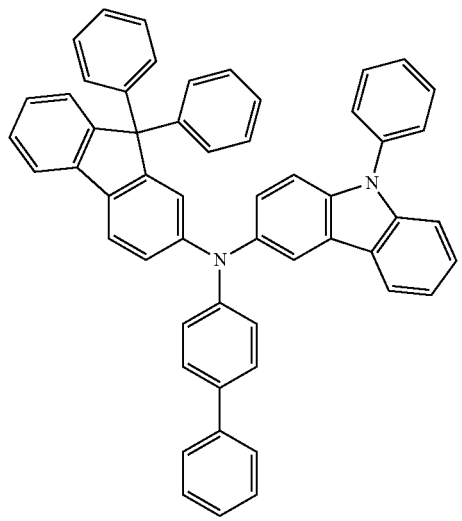
Compound 119
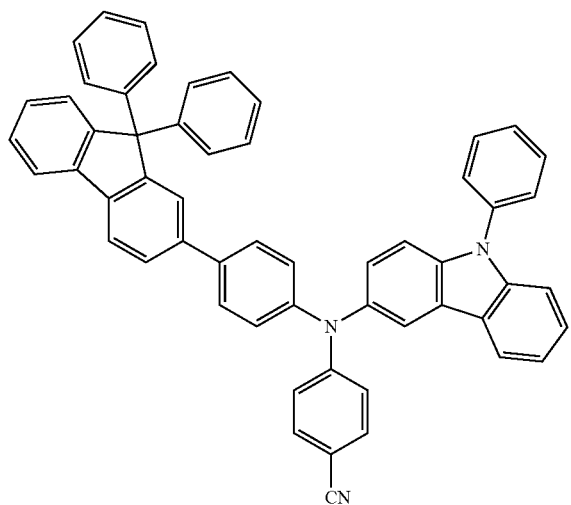

-continued
Compound 120
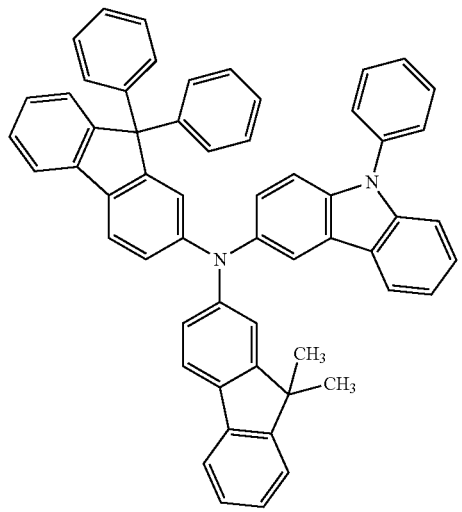
Compound 121
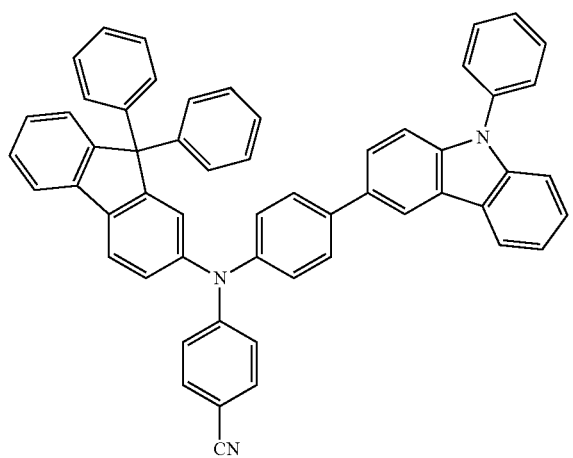
Compound 122
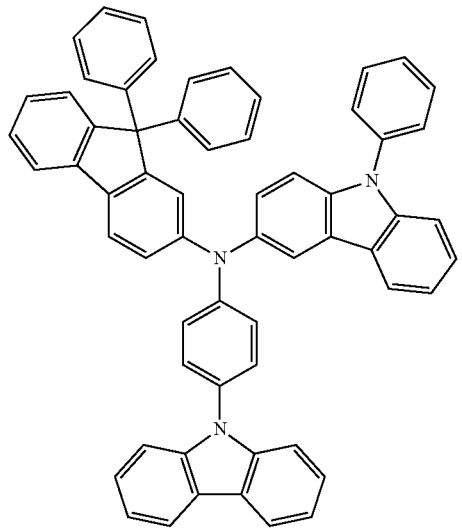

Compound 123
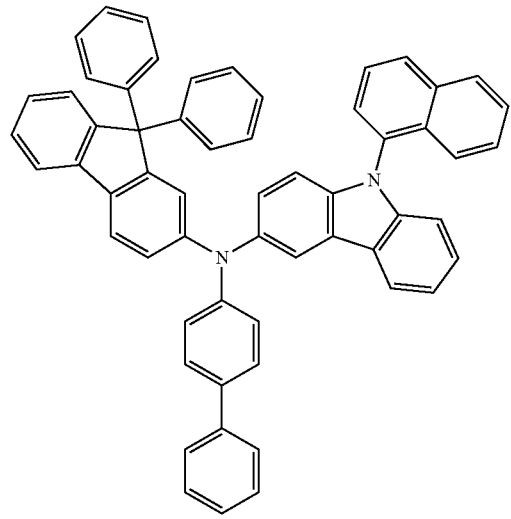
Compound 124
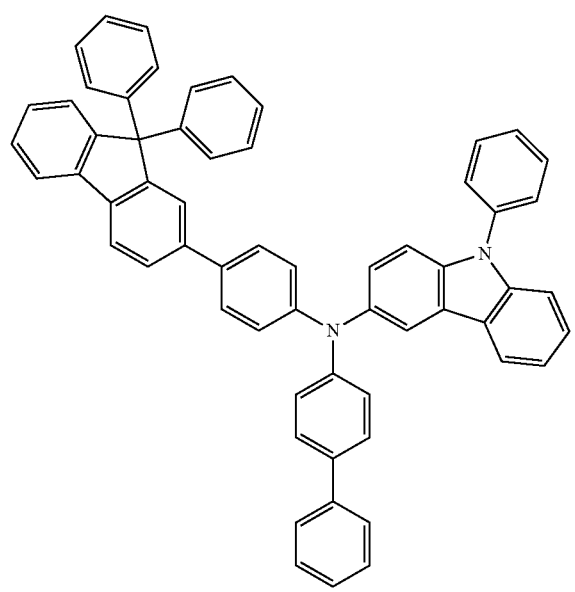
Compound 125
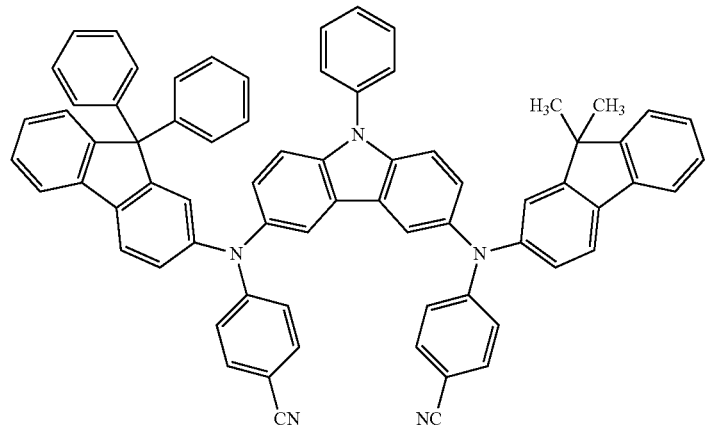

-continued
Compound 126
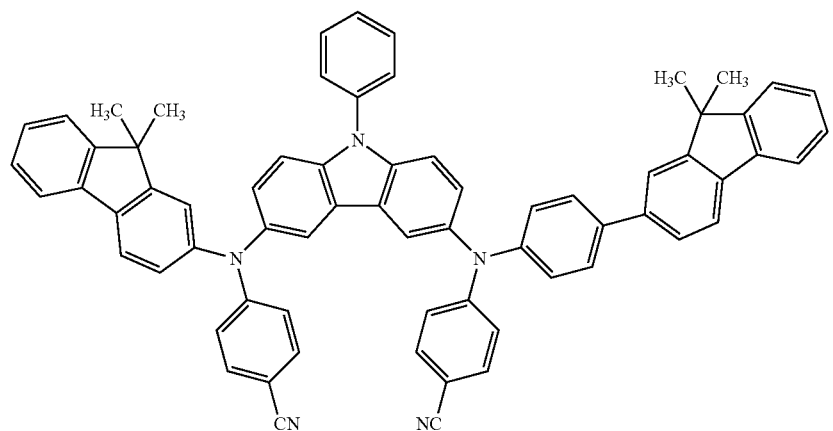
Compound 127
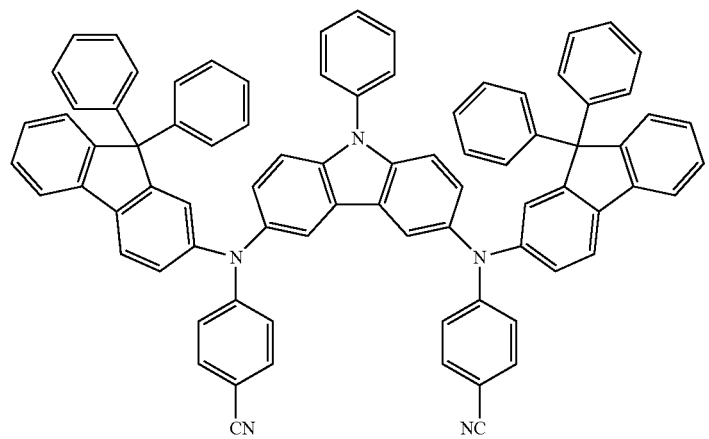
Compound 128
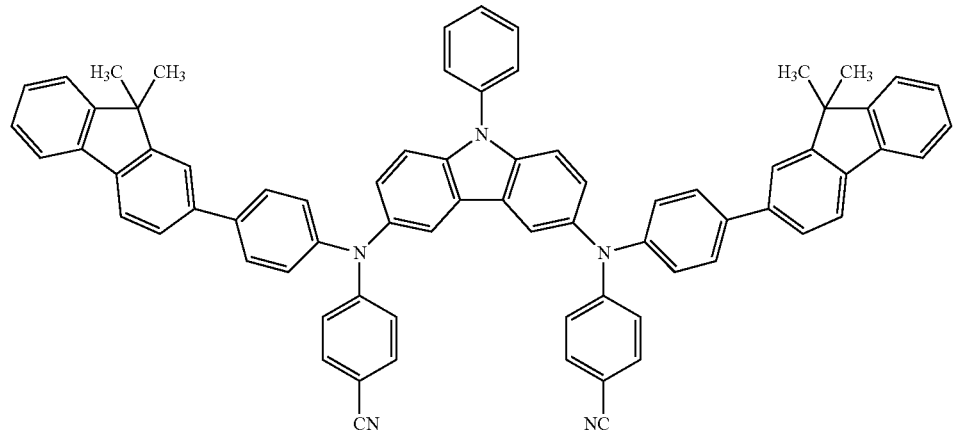

-continued
Compound 129
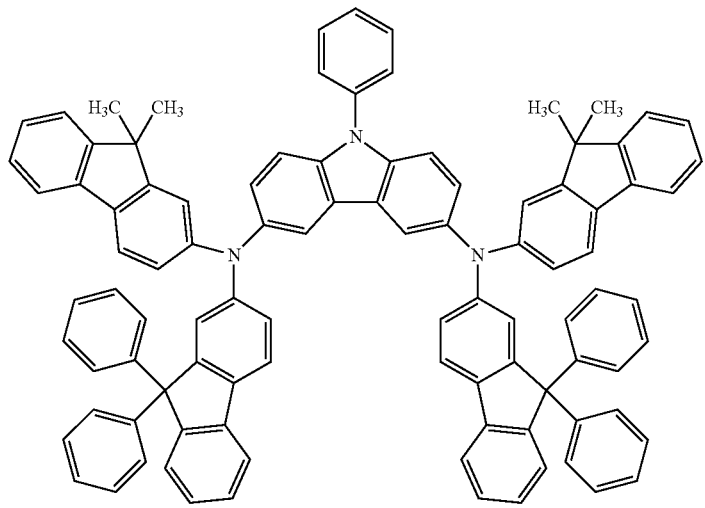
Compound 130
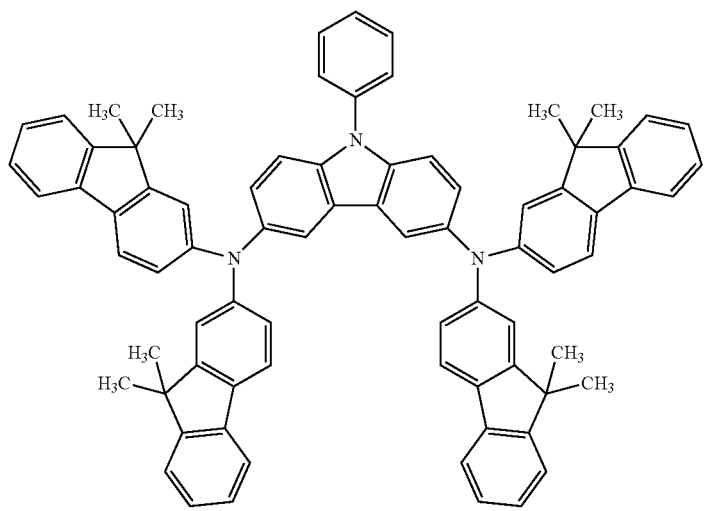
Compound 131
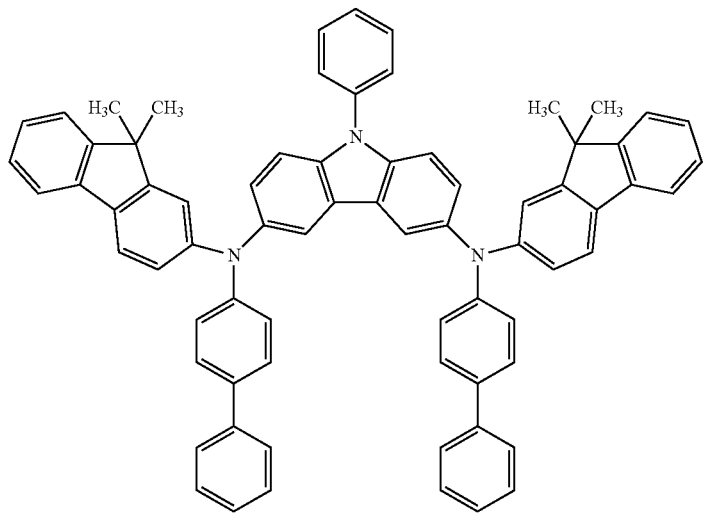

-continued
Compound 132
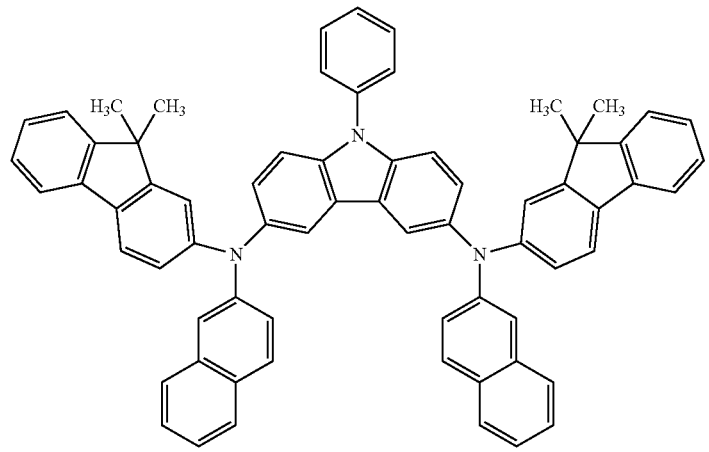
Compound 133
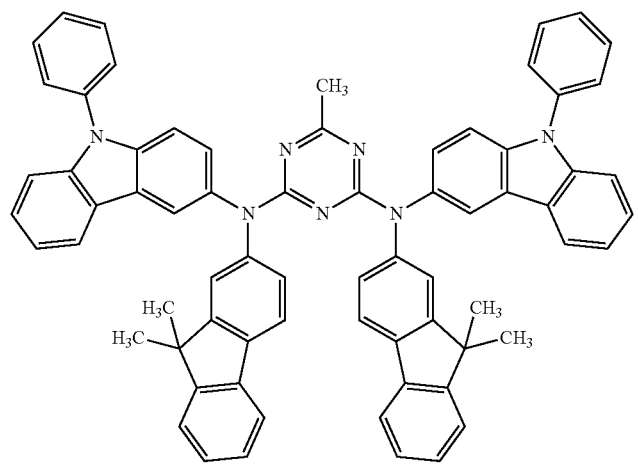
Compound 134
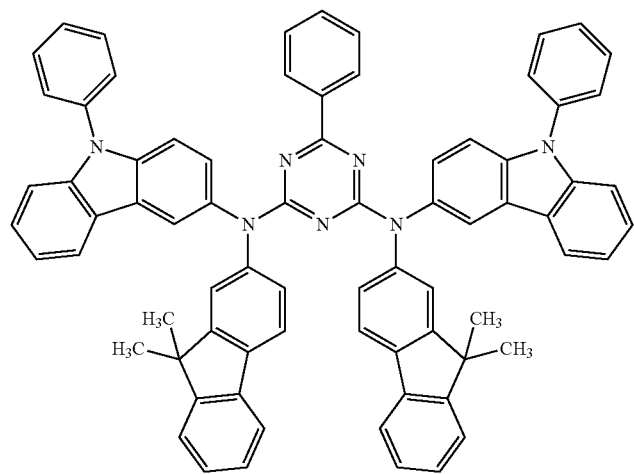

Compound 135
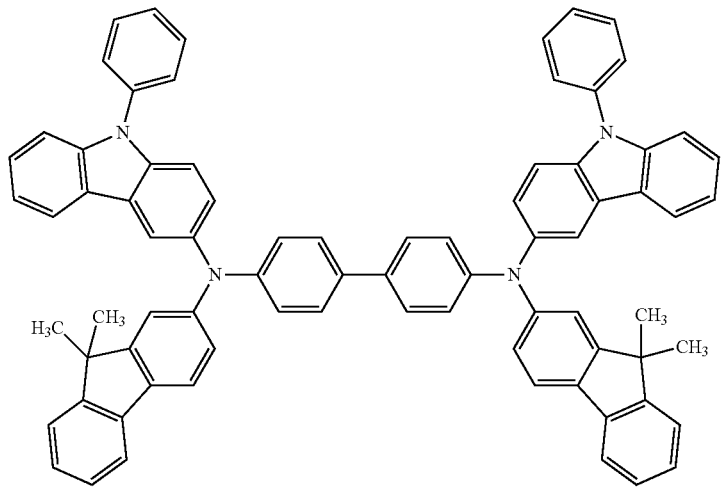
Compound 136
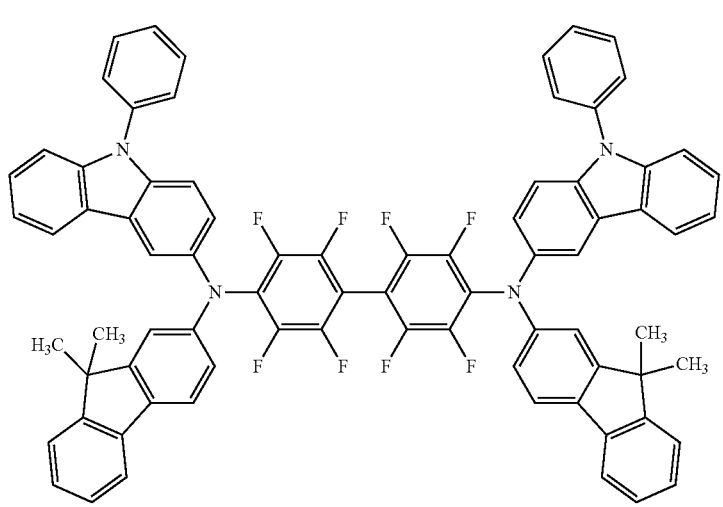
Compound 137
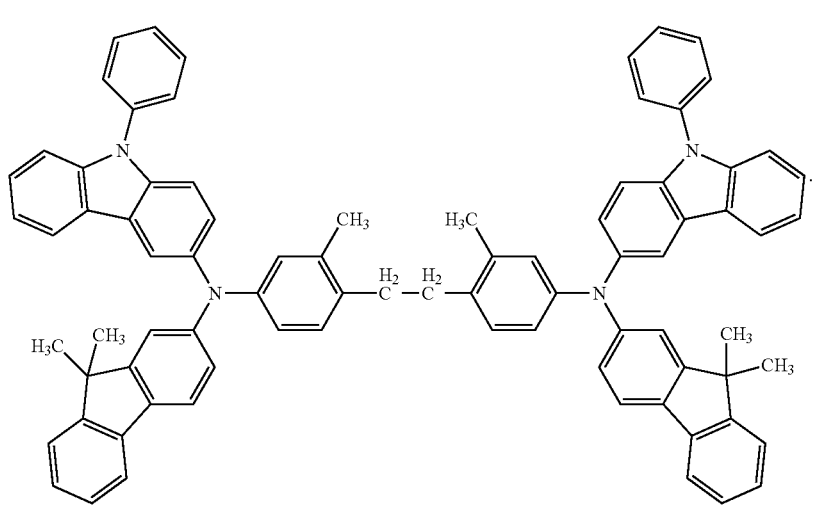

The term "substituted A" in "substituted or unsubstituted A (A is a certain substituent)" used herein indicates that at least one hydrogen atom of A is substituted with one substituent selected from the group consisting of a deuterium atom, a halogen atom, a hydroxyl group, a cyano group, a nitro group, a carboxyl group or a salt derivative thereof, a sulfonic acid group or a salt derivative thereof, a phosphoric acid group or a salt derivative thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, a $C_3$-$C_{30}$ heteroaryl group, a group represented by $N(Q_{201})(Q_{202})$, and a group represented by $Si(Q_{203})(Q_{204})(Q_{205})$. In this regard, $Q_{201}$ through $Q_{205}$ may be each independently a hydrogen atom, a deuterium atom, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, or a $C_3$-$C_{30}$ heteroaryl group.

For example, the term "substituted A" used herein indicates that at least one hydrogen atom of A is substituted with one selected from the group consisting of a deuterium atom, a halogen atom, a hydroxyl group, a cyano group, a nitro group, a carboxyl group, a methyl group, an ethyl group, a propyl group, a butyl group, a phenyl group, a pentalenyl group, an indenyl group, a naphtyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, and a dibenzothiophenyl group.

The substituted $C_1$-$C_{30}$ alkyl group denotes a saturated hydrocarbon group having a linear and branched structure in which one hydrogen atom is lacking in alkane. Examples of the unsubstituted $C_1$-$C_{30}$ alkyl group may include methyl, ethyl, propyl, isobutyl, sec-butyl, pentyl, iso-amyl, hexyl, and the like. A detailed description of a substituent of the substituted $C_1$-$C_{30}$ alkyl group is already provided in the description for the "substituted A."

The unsubstituted $C_2$-$C_{30}$ alkenyl group denotes a terminal group containing at least one carbon double bond at the middle or the end of the unsubstituted $C_2$-$C_{30}$ alkyl group. Examples of the unsubstituted $C_2$-$C_{30}$ alkenyl group may include ethenyl, prophenyl, butenyl, pentanyl, hexenyl, heptenyl, octenyl, propadienyl, isoprenyl, allyl, and the like. A detailed description of a substituent of the substituted $C_2$-$C_{30}$ alkenyl group is already provided in the description for the "substituted A."

The unsubstituted $C_2$-$C_{30}$ alkynyl group denotes a terminal group containing at least one carbon triple bond at the middle or the end of the unsubstituted $C_2$-$C_{60}$ alkyl group. The unsubstituted $C_2$-$C_{30}$ alkynyl group may be acetylenyl. A detailed description of a substituent of the substituted $C_2$-$C_{30}$ alkynyl group is already provided in the description for the "substituted A."

The unsubstituted $C_1$-$C_{30}$ alkoxy group has a Formula of —OY (Y is the unsubstituted $C_1$-$C_{30}$ alkyl group) and may be, for example, methoxy, ethoxy, isopropyloxy, butoxy, pentoxy, and the like. A detailed description of a substituent of the substituted $C_1$-$C_{30}$ alkoxy group is already provided in the description for the "substituted A."

The unsubstituted $C_3$-$C_{30}$ cycloalkyl group denotes a ring-type saturated hydrocarbon group and may be, for example, cyclopropyl, cyclobutyl, cyclopentyl, cyclohexyl, cyclooctyl, and the like. A detailed description of a substituent of the substituted $C_3$-$C_{30}$ cycloalkyl group is already provided in the description for the "substituted A."

The unsubstituted $C_3$-$C_{30}$ cycloalkenyl group denotes a ring-type unsaturated hydrocarbon group which has at least one carbon double bond and is not an aromatic ring. Examples of the unsubstituted $C_3$-$C_{30}$ cycloalkenyl group may include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cyclooctadienyl group, and the like. A detailed description of a substituent of the substituted $C_3$-$C_{60}$ cycloalkenyl group is already provided in the description for the "substituted A."

The unsubstituted $C_5$-$C_{30}$ aryl group denotes a monovalent group having a $C_5$-$C_{30}$ carbocyclic aromatic system, wherein the monovalent group may be a monocyclic or polycyclic group. In the polycyclic group, at least two rings included therein may be fused with each other. Examples of the unsubstituted $C_5$-$C_{30}$ aryl group may include phenyl, pentalenyl, indenyl, naphtyl, azulenyl, heptalenyl, indacenyl, acenaphtyl, fluorenyl, spiro-fluorenyl, phenalenyl, phenanthrenyl, anthryl, fluoranthenyl, triphenylenyl, pyrenyl, chrysenyl, naphthacenyl, picenyl, perylenyl, pentaphenyl, hexacenyl, and the like. A detailed description of a substituent of the substituted $C_5$-$C_{30}$ aryl group is already provided in the description for the "substituted A."

The unsubstituted $C_5$-$C_{30}$ aryloxy group denotes a monovalent group, to which carbon atoms of the $C_5$-$C_{30}$ aryl group are attached through an oxygen linking group (—O—). A detailed description of a substituent of the substituted $C_5$-$C_{30}$ aryloxy group is already provided in the description for the "substituted A."

The unsubstituted $C_5$-$C_{30}$ arylthio group denotes a monovalent group, to which carbon atoms of the $C_5$-$C_{30}$ aryl group are attached through a sulfur linking group (—S—). Examples of the unsubstituted $C_5$-$C_{30}$ arylthio group may include phenylthio, naphtylthio, indanylthio, and indenylthio. A detailed description of a substituent of the substituted $C_5$-$C_{30}$ arylthio group is already provided in the description for the "substituted A."

The unsubstituted $C_3$-$C_{30}$ heteroaryl group denotes a monocyclic or polycyclic group including at least one ring containing at least one heteroatom selected from the group consisting of N, O, P, and S. In the polycyclic group, at least two rings included therein may be fused with each other. Examples of the unsubstituted $C_3$-$C_{30}$ heteroaryl group may include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazole, oxadiazolyl, triazinyl, benzooxazolyl, and the like. A detailed description of a substituent of the substituted $C_3$-$C_{30}$ heteroaryl group is already provided in the description for the "substituted A."

The unsubstituted $C_1$-$C_{30}$ alkylene group denotes a divalent group having a linear and branched structure, in which two hydrogen atoms are lacking in alkane. Examples of the unsubstituted $C_1$-$C_{30}$ alkylene group are already provided in the description with regards to the unsubstituted $C_1$-$C_{30}$ alkyl group. A detailed description of a substituent of the substituted $C_1$-$C_{30}$ alkylene group is already provided in the description for the "substituted A."

The unsubstituted $C_5$-$C_{30}$ arylene group may denote a divalent group having a $C_5$-$C_{30}$ carbocyclic aromatic system, wherein the divalent group may be a monocyclic or polycyclic group. Examples of the unsubstituted $C_5$-$C_{30}$ arylene group are already provided in the description with regards to the unsubstituted $C_5$-$C_{30}$ aryl group. A detailed description of a substituent of the substituted $C_5$-$C_{30}$ arylene group is already provided in the description for the "substituted A."

The first mixing layer 12 includes the first cyano group-containing compound and the first hole transporting compound, and the amount of the first cyano group-containing compound in the first mixing layer 12 may be in the range of about 0.5 to about 10 parts by weight based on 100 parts by weight of the first mixing layer 12. Similarly, the second mixing layer 14 includes the second cyano group-containing compound and the second hole transporting compound, and the amount of the second cyano group-containing compound in the second mixing layer 14 may be in the range of about 0.5 to 10 parts by weight based on 100 parts by weight of the second mixing layer 14. For example, the amount of each of the first and second cyano group-containing compounds may be in the range of about 0.7 to about 5.0 parts by weight based on 100 parts by weight of the first mixing layer 12 and the second mixing layer 14, respectively. In one embodiment, when the amount of each of the first and second cyano group-containing compounds is 0.5 parts by weight or greater, hole injection properties are enhanced, thereby obtaining satisfactory effects of a reduction in driving voltage. On the other hand and in another embodiment, when the amount of each of the first and second cyano group-containing compounds is 10 parts by weight or less, lateral leakage current in which holes are transferred in a horizontal direction does not occur.

The first cyano group-containing compound and the second cyano group-containing compound may be respectively included in the first mixing layer 12 and the second mixing layer 14 by various methods, such as doping.

The first mixing layer 12 may have a thickness of from about 50 to about 200 Å, and the second mixing layer 14 may have a thickness of from about 50 to about 200 Å. For example, the thickness of each of the first mixing layer 12 and the second mixing layer 14 may be in the range of about 70 to about 150 Å. In one embodiment, when the thickness of each of the first and second mixing layers 12 and 14 is within this range, a resistance is appropriate, and thus satisfactory effects of a reduction in driving voltage may be obtained.

In an embodiment, the lowest unoccupied molecular orbital potential of the second hole transport layer 15 interposed between the emission layer 16 and the first hole transport layer 13 may be higher than that of the first hole transport layer 13. Of the plurality of hole transport layers of the organic light-emitting diode 100, the first hole transport layer 13 disposed near the first electrode 11 may include a first hole transporting compound with excellent hole injection properties and high conductivity, and the second hole transport layer 15 disposed near the emission layer 16 may include a second hole transporting compound, which is highly stable, whereby degradation by electrons injected from the emission layer 16 is reduced or prevented. The second hole transporting compound may have electron blocking properties, and the second hole transport layer 15 including the second hole transporting compound may prevent a reduction in lifetime of the organic light-emitting diode 100, caused by light emission and non-light emission quenching that may occur at an interface between the emission layer 16 and the second hole transport layer 15. The first hole transport layer 13 includes a compound with excellent hole injection properties, and thus injection of holes from the first electrode 11 is enhanced. The second hole transport layer 15 includes a compound with excellent electron blocking properties and high charge mobility, and thus it may be maintained stable with respect to electrons injected from the emission layer 16. From a view of position of energy band, the lowest unoccupied molecular orbital potential of the second hole transport layer 15 is higher than that of the first hole transport layer 13, and thus a charge balance in the emission layer 16 may be enhanced.

The first mixing layer 12 may contact the first electrode 11. The organic light-emitting diode 100 may have a structure in which the first mixing layer 12 is formed on the first electrode 11, and a hole injection layer is not formed. When the organic light-emitting diode 100 does not include the hole injection layer, manufacturing costs may be reduced. The first mixing layer 12 contacting the first electrode 11 may include the first hole transporting compound with excellent hole injection properties, and thus hole injection properties may be enhanced.

The organic light-emitting diode 100 may include at least two of hole transport layers and at least two of mixing layers. For example, the organic light-emitting diode 100 may further include a third hole transport layer and a third mixing layer. For example, the organic light-emitting diode 100 may further include a third hole transport layer (not shown) interposed between the first electrode 11 and the emission layer 16, and a third mixing layer (not shown) that is interposed between the first electrode 11 and the third hole transport layer and contacts the third hole transport layer. The third hole transport layer may include a third hole transporting compound, and the third mixing layer may include the third hole transporting compound and a third cyano group-containing compound. In one embodiment, the third hole transporting compound and the third cyano group-containing compound respectively correspond (e.g., be the same as) to the second hole transporting compound and the second cyano group-containing compound.

The term "organic layer" used herein refers to all the layers interposed between the first electrode 11 and the second electrode 19. The organic layer may be formed of not only organic compound, but may also include a metal complex.

The organic light-emitting diode 100 may further include at least one of an electron blocking layer or a hole blocking layer interposed between the first electrode 11 and the second electrode 19. For example, the organic light-emitting diode 100 may further include the electron blocking layer interposed between the emission layer 16 and the second hole transport layer 15, may further include the hole blocking layer interposed between the emission layer 16 and the electron transport layer 17, or may further include both the electron blocking layer and the hole blocking layer.

Figure 2:
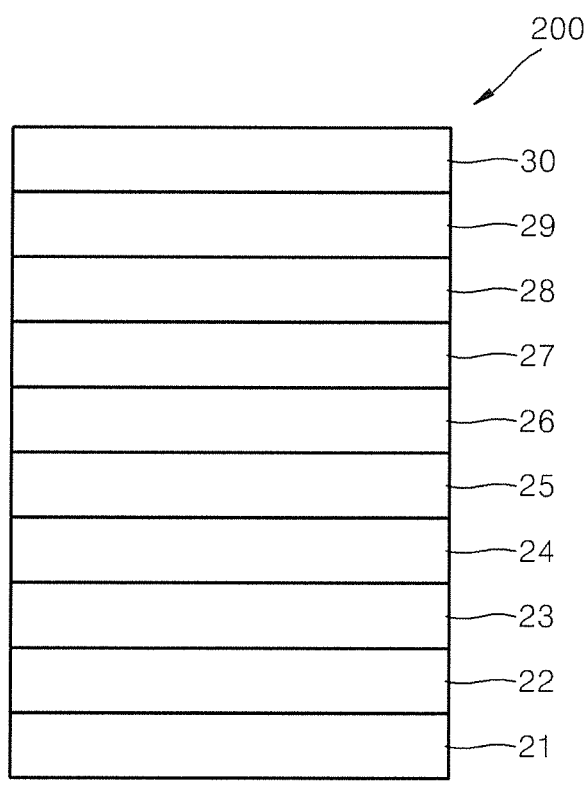
FIG. 2 is a schematic diagram illustrating a structure of a top-emission type organic light-emitting diode according to an embodiment.

FIG. 2 is a schematic diagram illustrating a structure of a top-emission type organic light-emitting diode 200 according to an embodiment.

Referring to FIG. 2, the organic light-emitting diode 200 includes a passivation layer 30 formed on a second electrode 29. The passivation layer 30 may be an organic layer, an inorganic layer, or a multiple layer thereof. The passivation layer 30 protects an organic layer from external moisture or oxygen, thereby protecting from or preventing degradation of the organic light-emitting diode 200. The organic light-emitting diode 200 is a top-emission type, and thus the passivation layer 30 may be transparent. In this regard, the passivation layer 30 may have a higher refractive index than the second electrode 29. When light emitted from the emission layer 26 is emitted outside through the second electrode 29 by adjusting the refractive indexes of the passivation layer 30 and the second electrode 29, total reflection at an interface between the second electrode 29 and the passivation layer 30 may be decreased and optical transmittance may be increased, whereby the organic light-emitting diode 200 may have desired luminous efficiency. To obtain a desired luminous efficiency, the refractive index of the passivation layer 30 may be 1.5 or greater, for example, in the range of about 1.7 to about 1.9.

At least one of the layers interposed between the first electrode and the second electrode of the organic light-emitting diode may be formed by deposition and/or using a wet process. For example, at least one selected from the group consisting of a first mixing layer, a first hole transport layer, a second mixing layer, a second hole transport layer, an emission layer, and an electron transport layer, which are interposed between the first electrode and the second electrode may be formed by deposition and/or using a wet process.

The term "wet process" used herein refers to a process for applying a mixture obtained by mixing a certain material and a certain solvent on a certain substrate, drying and/or heat treating the substrate so as to remove part of the solvent, and thereby forming a film including the material on the substrate.

The first mixing layer, the first hole transport layer, the second mixing layer, the second hole transport layer, the emission layer, and the electron transport layer may be formed using a well-known vacuum deposition method and/or a wet process.

For example, a mixture of the first hole transporting compound, the first cyano group-containing compound, and a solvent is provided to a region for forming a first mixing layer by spin coating, spraying, inkjet printing, dipping, casting, gravure coating, bar coating, roll coating, wirebar coating, screen coating, flexo coating, offset coating, and/or laser transferring; and the mixture provided to the region for forming a first mixing layer is then dried and/or heat treated so as to remove part of the solvent, thereby forming the first mixing layer.

Alternatively, a mixture layer including the first hole transporting compound and the first cyano group-containing compound may be formed on a base film by using a wet process as described above, and the mixture layer may be transferred to a region for forming a first mixing layer by laser transferring.

Hereinafter, the structure of the organic light-emitting diode 100 and a method of preparing the same will be described in more detail with reference to FIG. 1.

The organic light-emitting diode 100 includes the first electrode 11, the first mixing layer 12, the first hole transport layer 13, the second mixing layer 14, the second hole transport layer 15, the emission layer 16, the electron transport layer 17, the electron injection layer 18, and the second electrode 19, which are sequentially formed on a substrate.

The substrate may be a substrate used in a suitable organic light-emitting diode, and may be a glass substrate and/or a transparent plastic substrate having excellent mechanical strength, thermal stability, transparency, surface smoothness, ease of handling, and waterproofness.

The first electrode 11 may be formed by applying a first electrode material on the substrate by deposition and/or sputtering. When the first electrode 11 is an anode, the first electrode material may be selected from materials having a high work function so as to facilitate hole injection. The first electrode 11 may be a reflective electrode or a transparent electrode. Examples of the first electrode material may include indium-tin oxide (ITO), Indium-zinc-oxide (IZO), tin oxide ($SnO_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 11 may be formed as the reflective electrode. The first electrode 11 may include two different materials. For example, the first electrode 11 may be formed to have a two-layered structure including two different materials.

The first mixing layer 12 is formed on the first electrode 11.

The first mixing layer 12 may be formed on the first electrode 11 by using various suitable methods described above such as vacuum deposition, a wet process, and/or laser transferring.

When the first mixing layer 12 is formed by vacuum deposition, the deposition condition may vary according to a compound used as a material for forming the first mixing layer 12, a structure of a desired first mixing layer, and thermal characteristics. For example, the deposition condition may be, but is not limited to, a deposition temperature of about 100 to about 500° C., a degree of vacuum of about $10^{-8}$ to about $10^{-3}$ torr, and a deposition speed of about 0.01 to about 100 Å/sec.

When the first mixing layer 12 is formed by spin coating in a wet process, the deposition condition may vary according to a compound used as a material for forming the first mixing layer 12, a structure of a desired first mixing layer, and thermal characteristics. For example, the deposition condition may be, but is not limited to, a coating speed of about 2000 rpm to about 5000 rpm and a heat treatment temperature for removing a solvent after coating of about 80 to about 200° C.

The material for forming the first mixing layer may be prepared by doping a first hole transporting compound with a first cyano group-containing compound. The first cyano group-containing compound may have a doping concentration of about 0.5 to about 10 parts by weight based on 100 parts by weight of the first mixing layer. In one embodiment, when the doping concentration of the first cyano group-containing compound is within this range, a reduction in driving voltage may be satisfactorily obtained, and lateral leakage current does not occur.

The first mixing layer 12 may have a thickness of about 50 Å to about 200 Å, for example, a thickness of about 70 Å to about 150 Å. In one embodiment, when the thickness of the first mixing layer 12 is within this range, a satisfactory reduction in driving voltage is obtained without a substantial increase in driving voltage.

Next, the first hole transport layer 13 may be formed on the first mixing layer 12 by vacuum deposition, a wet process, and/or laser transferring. When the first hole transport layer 13 is formed by vacuum deposition and/or spin coating, the deposition and coating conditions may vary according to a compound used as a material for forming the first hole transport layer. However, in general, the conditions may be almost or substantially the same as the condition for forming the first mixing layer 12.

A material for forming the first hole transport layer 13 may be a compound represented by Formula 101 or 102 above. The first hole transport layer 13 may further include a well-known hole transporting material, for example, TPD (refer to the following formula) or NPB (refer to the following formula).

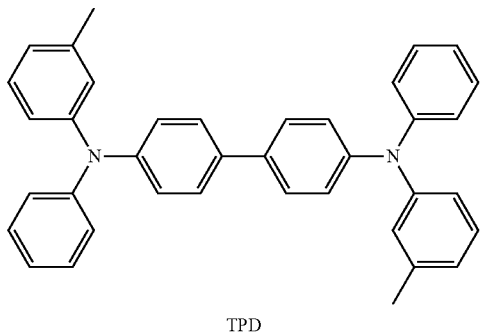

TPD

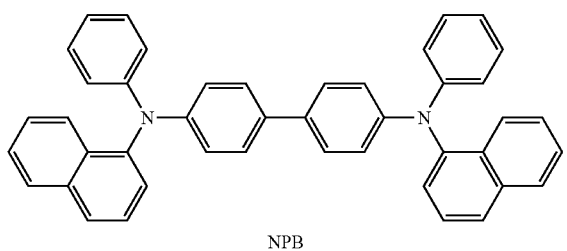

NPB

The first hole transport layer 13 may have a thickness of about 50 Å to about 1,000 Å, for example, a thickness of about 100 Å to about 800 Å. In one embodiment, when the thickness of the first hole transport layer 13 is within this range, satisfactory hole transport properties is obtained without a substantial increase in driving voltage.

The second mixing layer 14 may be formed on the first hole transport layer 13 by vacuum deposition, a wet process, or laser transferring. When the second mixing layer 14 is formed by vacuum deposition or spin coating, the deposition and coating conditions may vary according to a compound used as a material for forming the second mixing layer. However, in general, the conditions may be almost the same as the condition for forming the first mixing layer 12.

The material for forming the second mixing layer may be prepared by doping a second hole transporting compound with a second cyano group-containing compound. The second cyano group-containing compound may have a doping concentration of about 0.5 to about 10 parts by weight based on 100 parts by weight of the second mixing layer. In one embodiment, when the doping concentration of the second cyano group-containing compound is within this range, a satisfactory reduction in driving voltage is obtained and lateral leakage current does not occur.

The second mixing layer 14 may have a thickness of about 50 Å to about 200 Å, for example, a thickness of about 70 Å to about 150 Å. In one embodiment, when the thickness of the second mixing layer 14 is within this range, a satisfactory reduction in driving voltage is obtained without a substantial increase in driving voltage.

The second hole transport layer 15 may be formed on the second mixing layer 14 by vacuum deposition, a wet process, or laser transferring. When the second hole transport layer 15 is formed by vacuum deposition or spin coating, the deposition and coating conditions may vary according to a compound used as a material for forming the second hole transport layer. However, in general, the conditions may be almost the same as the condition for forming the first mixing layer 12.

A material for forming the second hole transport layer 15 may be a compound represented by Formula 101 or 102 above. The second hole transport layer 15 may further include a well-known hole transporting material, for example, TPD or NPB.

The second hole transport layer 15 may have a thickness of about 50 Å to about 1,000 Å, for example, a thickness of about 100 Å to about 800 Å. In one embodiment, when the thickness of the second hole transport layer 15 is within this range, satisfactory hole transport properties is obtained without a substantial increase in driving voltage.

Next, the emission layer 16 may be formed on the second hole transport layer 15 by vacuum deposition, a wet process, and/or laser transferring. When the emission layer 16 is formed by vacuum deposition or spin coating, the deposition and coating conditions may vary according to a compound used as a material for forming the emission layer. However, in general, the conditions may be almost the same as the condition for forming the first mixing layer 12.

The emission layer 16 may further include well-known phosphorescent host, fluorescent host, phosphorescent dopant, or fluorescent dopant. Examples of the well-known host may include, but are not limited to, 4,4'-N,N'-dicarbazole-biphenyl (CBP), 9,10-di-naphthalene-2-yl-anthracene (AND) (refer to Formula below), TPBI (refer to Formula below), TBADN (refer to Formula below), and E3 (refer to Formula below).

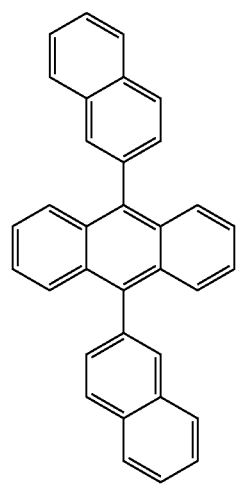

AND

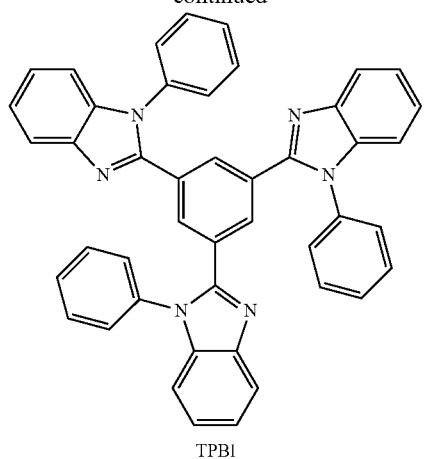

TPBI

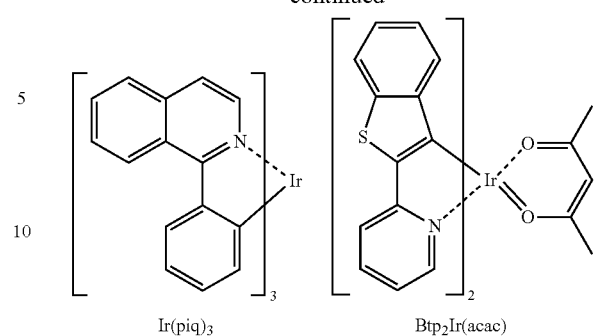

Ir(piq)₃    Btp₂Ir(acac)

Examples of a green dopant may include, but are not limited to, Ir(ppy)₃ (ppy=phenyl-pyridines, refer to Formula below), Ir(ppy)₂(acac) (refer to Formula below), and Ir(m-pyp)₃ (refer to Formula below).

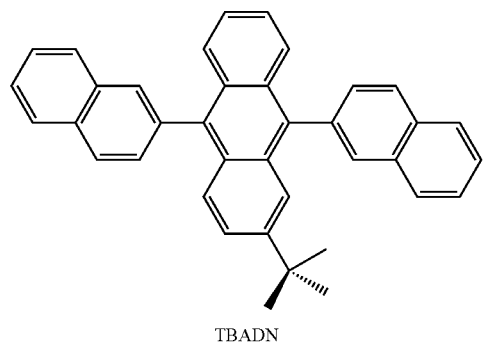

TBADN

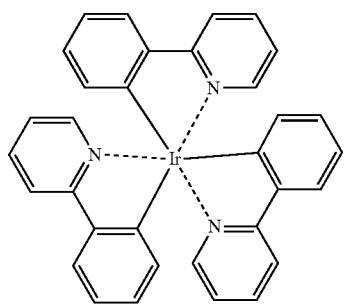

Ir(ppy)₃

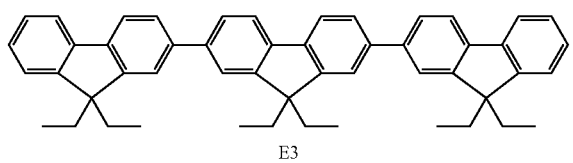

E3

Examples of a red dopant may include, but are not limited to, PtOEP (refer to Formula below), Ir(piq)₃ (refer to Formula below), and Btp₂Ir(acac) (refer to Formula below).

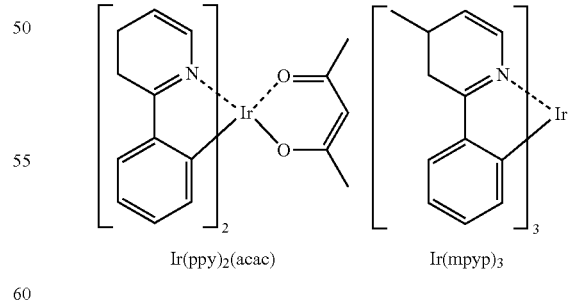

Ir(ppy)₂(acac)    Ir(mpyp)₃

Examples of a blue dopant may include, but are not limited to, F₂Irpic (refer to Formula below), (F₂ppy)₂Ir(tmd) (refer to Formula below), Ir(dfppz)₃ (refer to Formula below), DPVBi (refer to Formula below), 4,4'-bis(4-diphenylaminosteril)biphenyl (DPAVBi) (refer to Formula below), or 2,5,8,11-tetra-tert-butylpherylene (TBPe) (refer to Formula below.

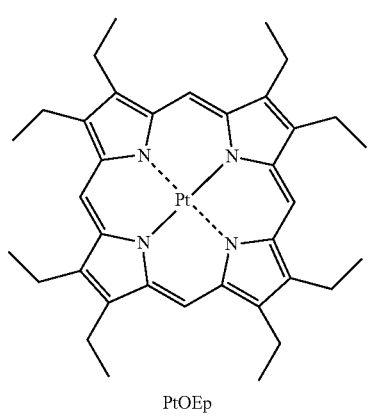

PtOEp

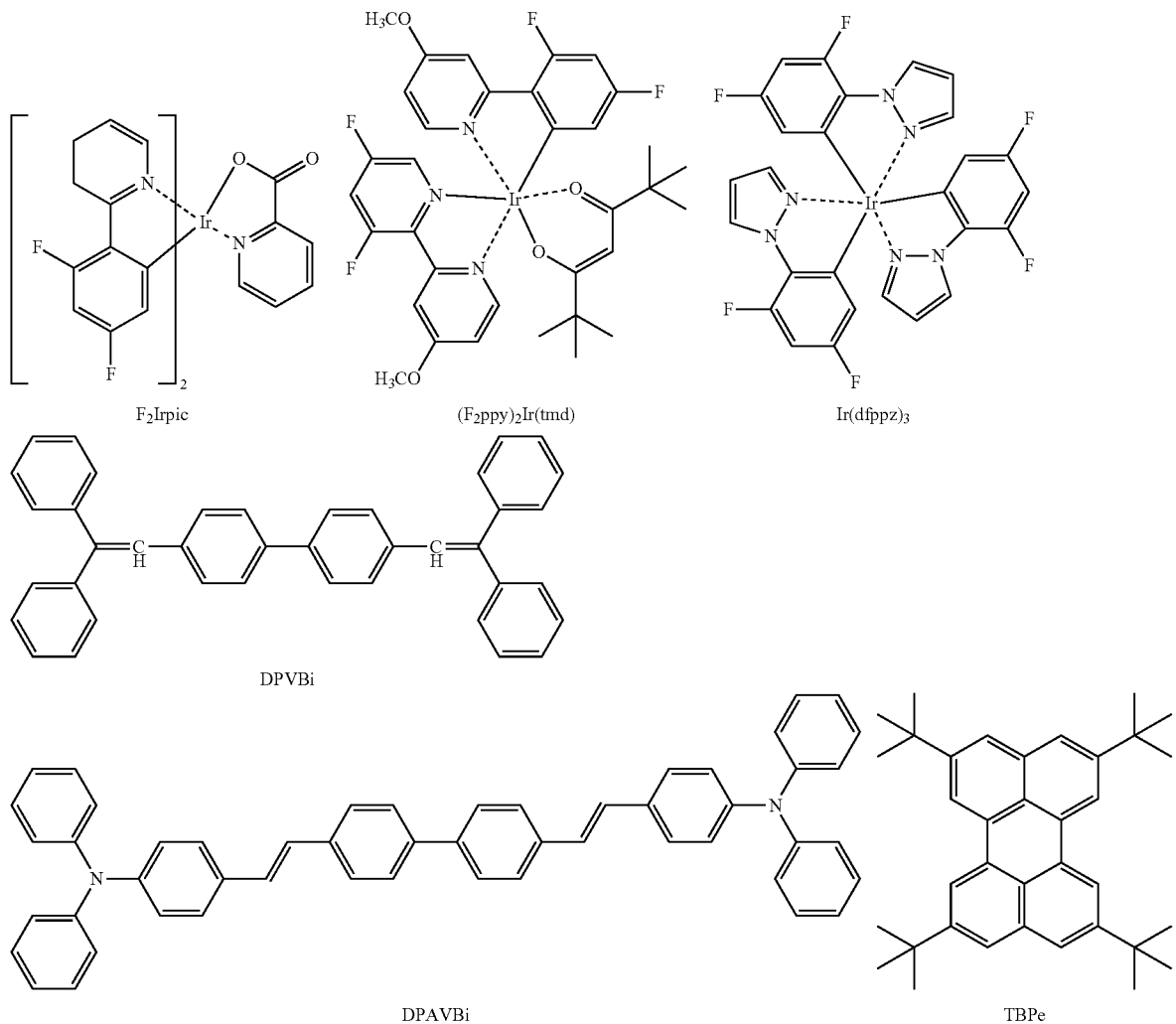

When the emission layer 16 includes a host and a dopant, the amount of the dopant may be generally in the range of about 0.01 to about 15 parts by weight based on 100 parts by weight of the host; however, it is not limited thereto.

The thickness of the emission layer 16 may be in the range of about 100 Å to about 1,000 Å, for example, in the range of about 200 Å to about 600 Å. In one embodiment, when the thickness of the emission layer 16 is within this range, excellent light emission properties are obtained without a substantial increase in driving voltage.

When the phosphorescent dopant is included in the emission layer 16, a hole blocking layer (HBL) (not shown) may be formed between the second hole transport layer 15 and the emission layer 16 by vacuum deposition, a wet process, and/or laser transferring so as to protect or prevent triplet excitons or holes from being diffused to the electron transport layer 17. When the hole blocking layer is formed by vacuum deposition and spin coating, the conditions thereof may vary according to a used compound. However, in general, the conditions may be almost the same as the condition for forming the first mixing layer 12. The hole blocking layer may include a suitable hole blocking material. Examples of the well-known hole blocking material may include an oxadiazole derivative, a triazole derivative, and a phenanthroline derivative.

The thickness of the hole blocking layer may be in the range of about 50 Å to about 1,000 Å, for example, in the range of about 100 Å to about 300 Å. In one embodiment, when the thickness of the hole blocking layer is within this range, excellent hole blocking properties are obtained without a substantial increase in driving voltage.

Next, the electron transport layer 17 may be formed on the emission layer 16 by vacuum deposition, a wet process, and/or laser transferring. When the electron transport layer 17 is formed by vacuum deposition and/or spin coating, the deposition and coating conditions may vary according to a compound used as a material for forming the electron transport layer. However, in general, the conditions may be almost the same as the condition for forming the first mixing layer 12. The electron transport layer 17 may include a suitable electron transporting material to stably transport electrons injected from a cathode. Examples of the suitable electron transporting material may include, but are not limited to, a quinoline derivative, in particular, tris(8-quinolinolate)aluminum ($Alq_3$), TAZ (refer to Formula below), BAlq (refer to Formula below), and beryllium bis(benzoquinolin-10-olate) ($Bebq_2$).

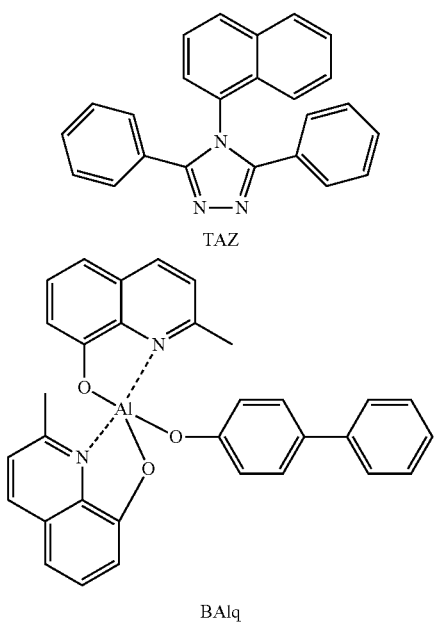

TAZ

BAlq

The thickness of the electron transport layer 17 may be in the range of about 100 Å to about 1,000 Å, for example, in the range of about 150 Å to about 500 Å. In one embodiment, when the thickness of the electron transport layer 17 is within this range, satisfactory electron transport properties are obtained without a substantial increase in driving voltage.

Also, the electron injection layer 18, which facilitates electron injection from a cathode, may be formed on the electron transport layer 17. A material for forming the electron injection layer 18 may include a suitable material for forming an electron injection layer, such as LiF, NaCl, CsF, $Li_2O$, or BaO. The deposition condition of the electron injection layer 18 may vary according a used compound. However, in general, the condition may be almost the same as the condition for forming the first mixing layer 12.

The thickness of the electron injection layer 18 may be in the range of about 1 Å to about 100 Å, for example, in the range of about 3 Å to about 90 Å. In one embodiment, when the thickness of the electron injection layer 18 is within this range, satisfactory electron injection properties are obtained without a substantial increase in driving voltage.

The second electrode 19 is formed on the electron injection layer 18. The second electrode 19 may be a cathode, which is an electron injection electrode. Here, a metal for forming the second electrode 19 may include a metal having low work function, such as metal, an alloy, an electric conducting compound, and a mixture thereof. In particular, the second electrode 19 may be formed as a thin film by using lithium (Li), magnesium (Mg), aluminum (Al), aluminum-lithium (Al—Li), calcium (Ca), magnesium-indium (Mg—In), or magnesium-silver (Mg—Ag). In order to obtain a top-emission type organic light-emitting diode, the second electrode 19 may be formed as a transparent electrode by using ITO or IZO.

A passivation layer (not shown) may be formed on the second electrode 19. The passivation layer may be an organic layer, an inorganic layer, or a multiple layer thereof. When the passivation layer is an inorganic layer, the passivation layer may be an insulating layer such as an $SiO_2$ layer, an $SiN_x$ layer, an $SiO_xN_y$ layer, or an LiF layer. In addition, the passivation layer as an organic layer may include N,N'-Bis(naphthalen-1-yl)-N,N'-bis(phenyl)benzidine (NPB), TNATA, TCTA, TDAPB, TDATA, $Alq_3$, Balq, or CBP. The passivation layer as an inorganic layer may be formed by sputtering, and the passivation layer as an organic layer may be formed by evaporation or chemical vapor deposition (CVD). When the passivation layer is formed by sputtering, however, the organic light-emitting diode may be damaged, and thus the passivation layer may be formed by evaporation or CVD that causes relatively less damage in the organic light-emitting diode. Therefore, the passivation layer may be an organic layer.

Meanwhile, the top-emission type organic light-emitting diode 200 of FIG. 2 has a structure similar to that of the organic light-emitting diode 100 of FIG. 1. Here, referring to FIG. 2, the structure includes a first electrode 21, a first mixing layer 22, a first hole transport layer 23, a second mixing layer 24, a second hole transport layer 25, an emission layer 26, an electron transport layer 27, a electron injection layer 28, the second electrode 28, and the passivation layer 30, and may be manufactured by a manufacturing process similar to that of the organic light-emitting diode 100 of FIG. 1. In the top-emission type organic light-emitting diode 200, the second electrode 29 and the passivation layer 30 may be formed of a transparent material.

According to another embodiment of the present invention, a flat display device includes the organic light-emitting diode described above and a transistor including a source electrode, a drain electrode, a gate, and an active layer, wherein a first electrode of the organic light-emitting diode is electrically connected to one of the source electrode and the drain electrode.

The organic light-emitting diode may be included in a flat display device including a transistor. The active layer of the transistor may be an amorphous silicon layer, a crystalline silicon layer, an organic semiconductor layer, an oxide semiconductor layer, or the like.

An organic light-emitting diode according to an embodiment of the present invention will now be described in more detail with reference to the following Examples. These Examples are for illustrative purposes only and are not intended to limit the scope of the invention.

Example 1

As an anode, 15 Ω/$cm^2$ (1200 Å) of an ITO glass substrate from Corning Co., Ltd. was cut to a size of 50 mm×50 mm×0.7 mm, was ultrasonically washed with isopropyl alcohol and pure water each for 5 minutes, and then washed with UV ozone for 15 minutes.

A first mixing layer formed by doping Compound 105 represented above with a compound represented by Formula 20A where each of $R_{103}$ and $R_{109}$ is F was formed to a thickness of 100 Å on the ITO glass substrate, wherein the amount of the compound of Formula 20A is 1 part by weight based on 100 parts by weight of the first mixing layer. A first hole transport layer was formed to a thickness of 650 Å on the first mixing layer by using Compound 105 above.

A second mixing layer formed by doping Compound 105 represented above with a compound represented by Formula 20A where each of $R_{103}$ and $R_{109}$ is F was formed to a thickness of 100 Å on the first hole transport layer, wherein the amount of the compound of Formula 20A is 1 part by weight based on 100 parts by weight of the second mixing layer. A second hole transport layer was formed to a thickness of 650 Å on the second mixing layer by using Compound 105 above.

An emission layer was formed to a thickness of 200 Å on the second hole transport layer by using 97 wt % of 9,10-dinaphthalene-2-yl-anthracene (AND) and 3 wt % of 4,4'-bis (4-diphenylaminosteril)biphenyl (DPAVBi).

Aluminum tris(8-hydroxyquinoline) (Alq$_3$) was vacuum deposited on the emission layer to form an electron transport layer having a thickness of 300 Å. LiF was vacuum deposited on the electron transport layer to form an electron injection layer having a thickness of 5 Å, and Al was then vacuum deposited on the electron injection layer to form a cathode having a thickness of 3000 Å, thereby completing the manufacturing of an organic light-emitting diode.

Example 2

An organic light-emitting diode was manufactured in the same manner as in Example 1, except that the amount of the compound represented by Formula 20A where each of $R_{103}$ and $R_{109}$ is F, was 3 parts by weight based on 100 parts by weight of the first mixing layer.

Comparative Example 1

As an anode, 15 Ω/cm$^2$ (1200 Å) of an ITO glass substrate from Corning Co., Ltd. was cut to a size of 50 mm×50 mm×0.7 mm, was ultrasonically washed with isopropyl alcohol and pure water each for 5 minutes, and then washed with UV ozone for 15 minutes.

4,4',4''-tris[3-methylphenyl(phenyl)-amino]triphenylamine (m-MTDATA) was vacuum deposited on the ITO glass substrate to form a hole injection layer having a thickness of 700 Å, and hexanitrile hexaazatriphenylene was then subjected to resistance heating vapor deposition on the hole injection layer to form an intermediate layer having a thickness of 50 Å.

NPB was vacuum deposited on the intermediate layer to form a hole transport layer having a thickness of 750 Å.

An emission layer was formed to a thickness of 200 Å on the hole transport layer by using 97 wt % of ADN and 3 wt % of DPAVBi.

Alq$_3$ was vacuum deposited on the emission layer to form an electron transport layer having a thickness of 300 Å. LiF was vacuum deposited on the electron transport layer to form an electron injection layer having a thickness of 5 Å, and Al was then vacuum deposited on the electron injection layer to form a cathode having a thickness of 3000 Å, thereby completing the manufacturing of an organic light-emitting diode.

Evaluation Example

Driving voltage, conversion efficiency and image sticking at required luminance of each of the organic light-emitting diodes manufactured according to Examples 1 and 2 and Comparative Example 1 were evaluated by applying a current and a voltage thereto. The results are shown in Table 1 below.

TABLE 1

|  | Driving voltage (V) | Conversion efficiency (cd/A/y) | Image sticking (h) |
|---|---|---|---|
| Example 1 | 3.8 | 98.8 | 40 |
| Example 2 | 3.6 | 98.5 | 60 |
| Comparative Example 1 | 3.6 | 98.1 | 30 |

From the results shown in Table 1, it is confirmed that the organic light-emitting diodes of Examples 1 and 2 have a lower driving voltage, less occurrence of image sticking and a longer display time than the organic light-emitting diode of Comparative Example 1. From the results, it is confirmed that the organic light-emitting diodes of Examples 1 and 2 have excellent performances, such as low driving voltage and extended lifetime.

According to the one or more embodiments of the present invention, in an organic light-emitting diode having the structure described above, an interface resistance between a first electrode and an organic layer decreases, the number of free holes of a hole transport layer increases, and a bulk resistance of the hole transport layer decreases, whereby the organic light-emitting diode has a long lifetime. In addition, a flat display device including the organic light-emitting diode has excellent performances.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic light-emitting diode comprising:
a first electrode;
a second electrode facing the first electrode;
an emission layer between the first electrode and the second electrode;
a first hole transport layer comprising a first hole transporting compound;
a second hole transport layer comprising a second hole transporting compound, the first hole transport layer and the second hole transport layer being interposed between the first electrode and the emission layer;
an electron transport layer between the emission layer and the second electrode;
a first mixing layer between the first electrode and the first hole transport layer, contacting the first hole transport layer, and comprising the first hole transporting compound and a first cyano group-containing compound; and
a second mixing layer between the first electrode and the second hole transport layer, contacting the second hole transport layer, and comprising the second hole transporting compound and a second cyano group-containing compound.
2. The organic light-emitting diode of claim 1, wherein the first cyano group-containing compound and the second cyano group-containing compound are each independently represented by one of Formulae 1 through 20 below:

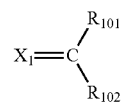

Formula 1

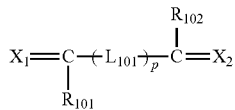

Formula 2

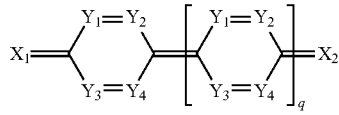

Formula 3

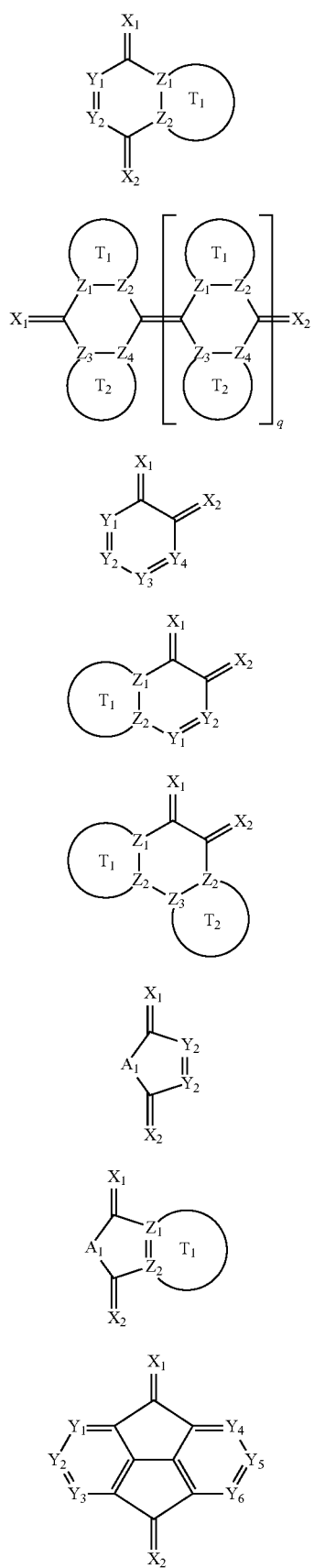
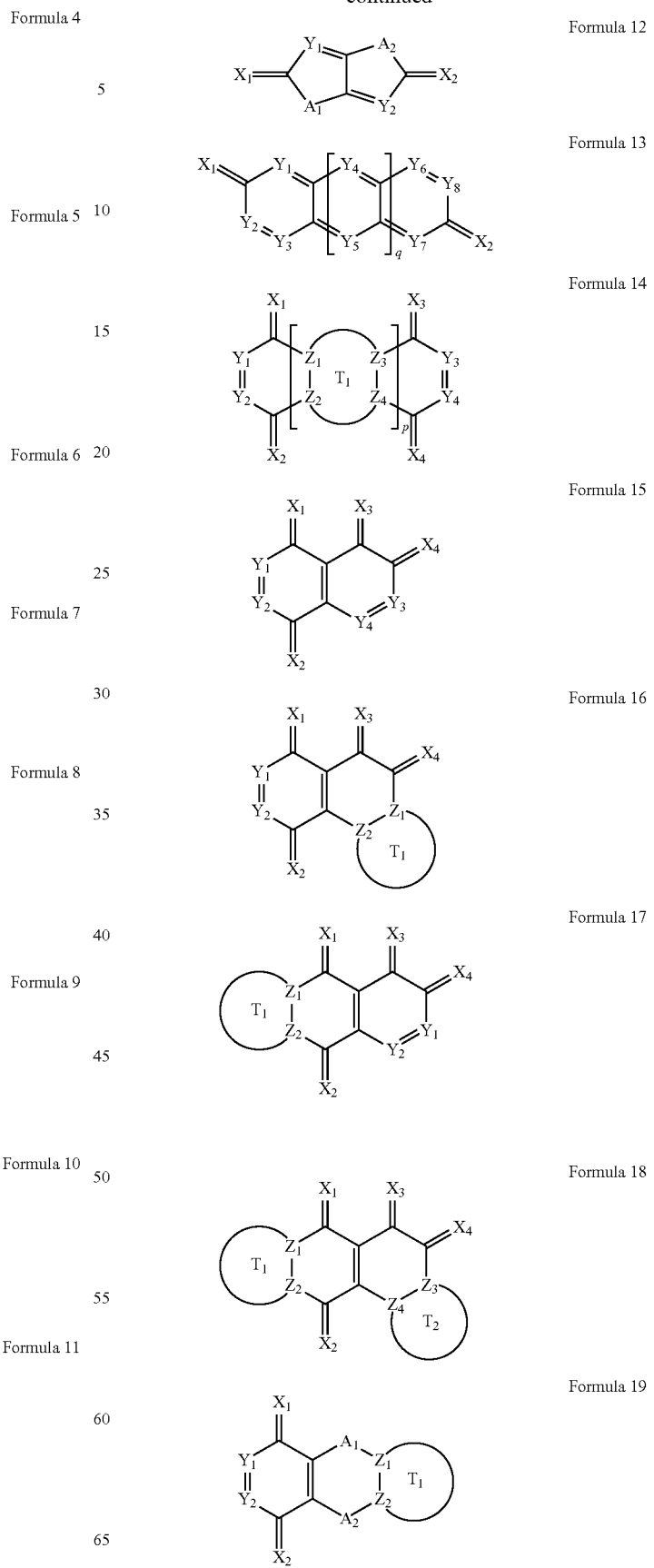

Formula 20

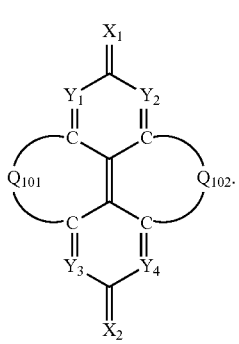

wherein:

$X_1$, $X_2$, $X_3$, and $X_4$ are each independently one of

NC–C(*)=C(CN)–, NC–C(*)=C(CF_3)–, NC–C(*)=C(NO_3)–, and N(*)=C(CN)–;

$Y_1$ through $Y_8$ are each independently N or $CR_{103}$;
$Z_1$, $Z_2$, $Z_3$, and $Z_4$ are each independently CH or N;
$A_1$ and $A_2$ are each independently O, S, $NR_{104}$, or $C(R_{105})(R_{106})$;
$L_{101}$ is one selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, and a substituted or unsubstituted $C_3$-$C_{30}$ heteroarylene group;
$Q_{101}$ and $Q_{102}$ are each independently a substituted or unsubstituted $C_1$-$C_{30}$ alkylene group or a substituted or unsubstituted $C_2$-$C_{30}$ alkenylene group;
$T_1$ and $T_2$ are each independently a substituted or unsubstituted $C_5$-$C_{30}$ aromatic ring system or a substituted or unsubstituted $C_3$-$C_{30}$ heteroaromatic ring system;
$R_{101}$, $R_{102}$, $R_{103}$, $R_{104}$, $R_{105}$, and $R_{106}$ are each independently a hydrogen atom, a deuterium atom, a halogen atom, a hydroxyl group, a cyano group, a nitro group, a carboxyl group,

[structures with CN groups]

a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, or $N(R_{107})(R_{108})$;
$R_{107}$ and $R_{108}$ are each independently one selected from the group consisting of a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_5$-$C_{30}$ aryl group, and a substituted or unsubstituted $C_3$-$C_{30}$ heteroaryl group;
p is an integer of 1 to 10; and
q is an integer of 0 to 10.

3. The organic light-emitting diode of claim 2, wherein $X_1$, $X_2$, $X_3$, and $X_4$ are each independently

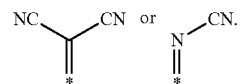

4. The organic light-emitting diode of claim 2, wherein $L_{101}$ is a substituted or unsubstituted thiophenylene group or a substituted or unsubstituted benzothiophenylene group.

5. The organic light-emitting diode of claim 2, wherein $T_1$ and $T_2$ are each independently one selected from the group consisting of a substituted or unsubstituted benzene, a substituted or unsubstituted naphthalene, a substituted or unsubstituted anthracene, a substituted or unsubstituted thiophene, a substituted or unsubstituted thiadiazole, and a substituted or unsubstituted oxadiazole.

6. The organic light-emitting diode of claim 2, wherein:
$R_{103}$ is one selected from the group consisting of a hydrogen atom, a halogen atom, a cyano group, a substituted or unsubstituted $C_1$-$C_{10}$ alkyl group, a substituted or unsubstituted $C_1$-$C_{30}$ alkoxy group, and $N(R_{107})(R_{108})$; and
each of $R_{107}$ and $R_{108}$ is independently one selected from the group consisting of a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, and a substituted or unsubstituted methylnaphthyl group.

7. The organic light-emitting diode of claim 2, wherein the first cyano group-containing compound and the second cyano group-containing compound are each independently represented by one of Formulae 1A through 20B below:

Formula 1A

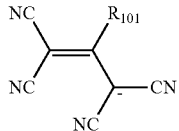

Formula 1B

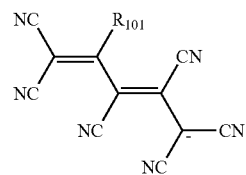

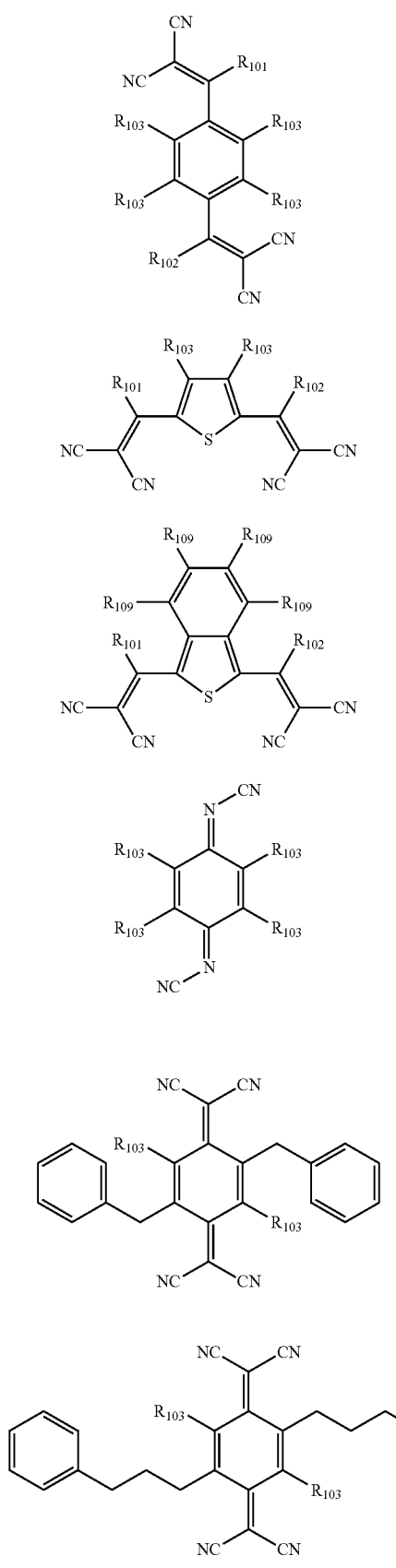
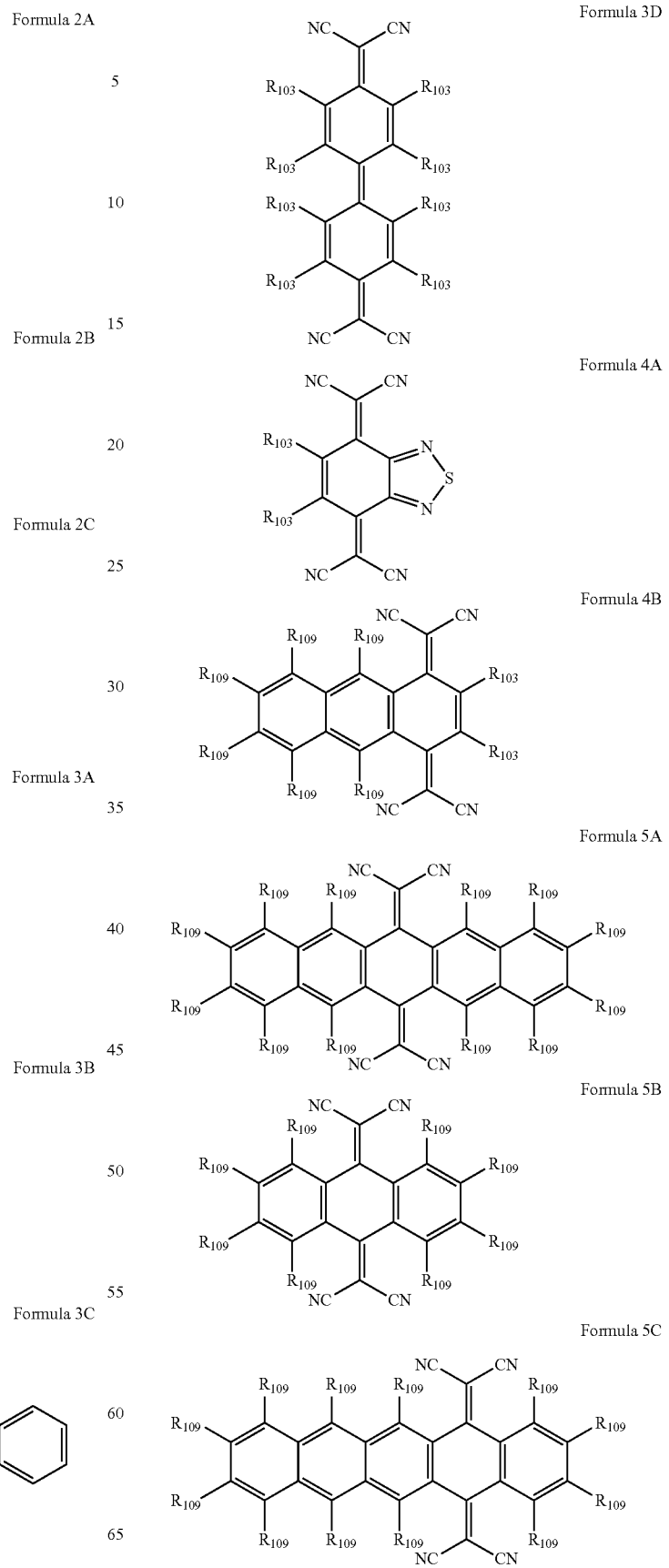

Formula 5D
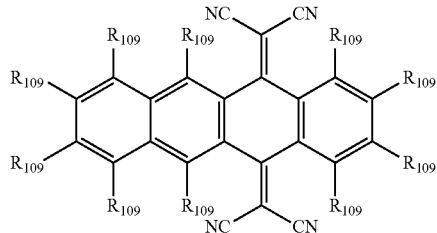
Formula 5E
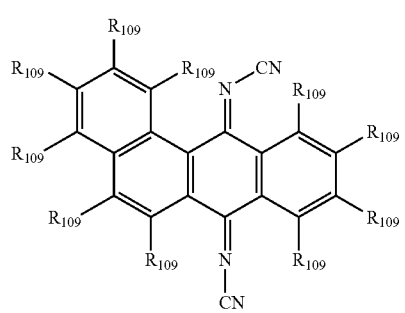
Formula 5F
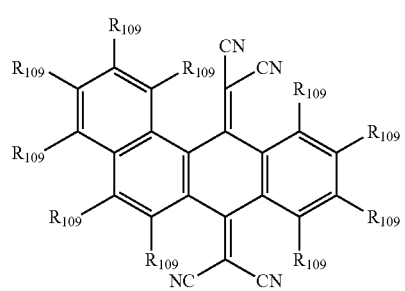
<Formula 5G
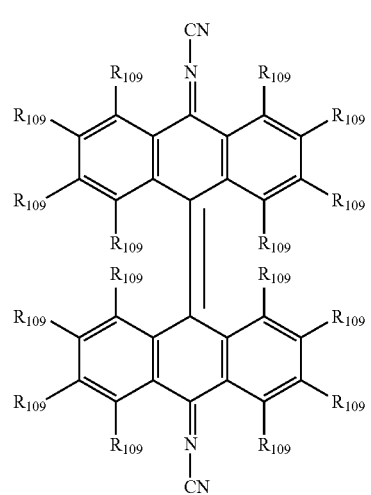
Formula 5H
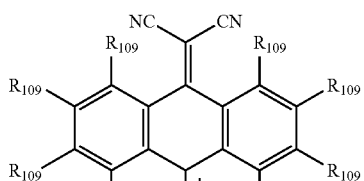
Formula 5I
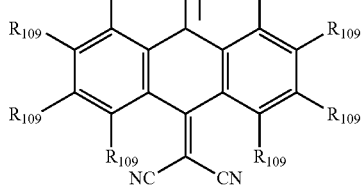
Formula 5J
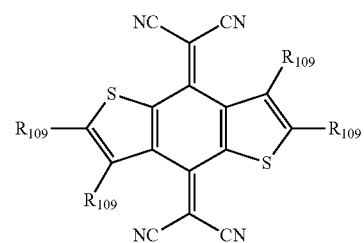
Formula 5K
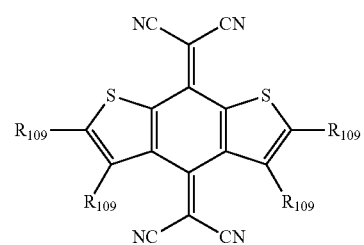
Formula 5L
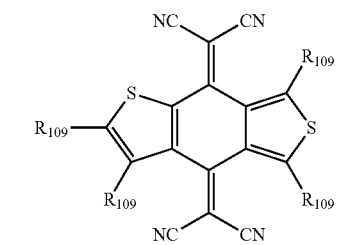

-continued

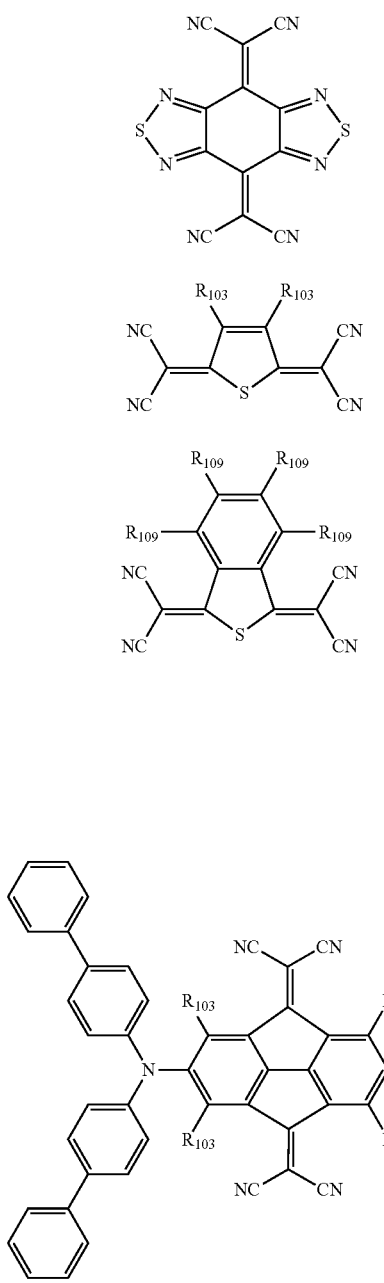

Formula 5M

Formula 9A

Formula 10A

Formula 11A

Formula 12A

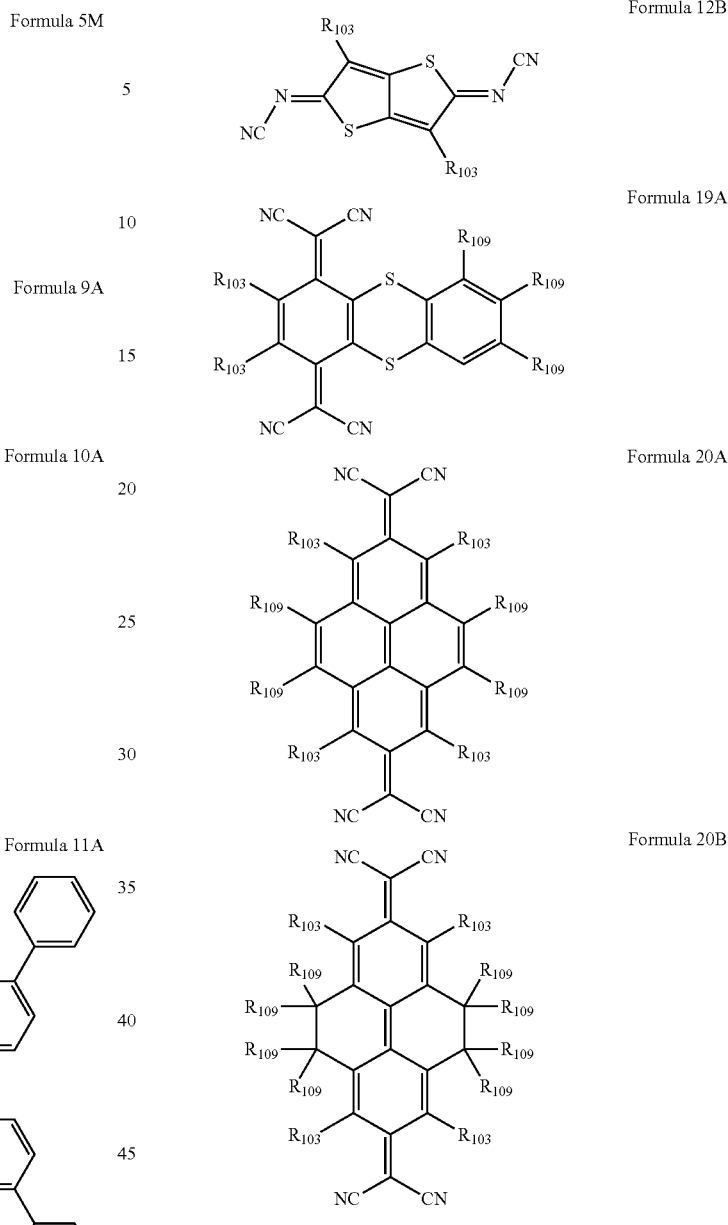

Formula 12B

Formula 19A

Formula 20A

Formula 20B wherein each of $R_{103}$ and $R_{109}$ is independently one selected from the group consisting of a hydrogen atom, a fluorine atom, a cyano group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted methoxy group, a substituted or unsubstituted ethoxy group, and a substituted or unsubstituted propoxy group.

8. The organic light-emitting diode of claim 1, wherein the first cyano group-containing compound is the same as the second cyano group-containing compound.

9. The organic light-emitting diode of claim 1, wherein the first hole transporting compound and the second hole transporting compound are each independently represented by Formula 101 or 102 below:

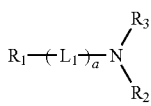

Formula 101

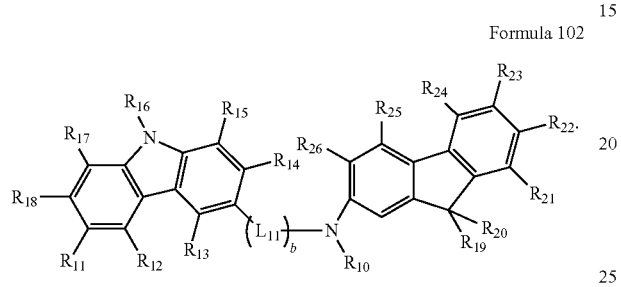

Formula 102 wherein:

$R_{10}$ is $-(Ar_1)_n-Ar_2$;

$R_{11}$ is $-(Ar_{11})_m-Ar_{12}$;

each of $L_1$, $L_{11}$, $Ar_1$, and $Ar_{11}$ is independently one selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, and $-N(Q_1)$-;

$R_1$ through $R_3$, $R_{12}$ through $R_{26}$, $Ar_2$, $Ar_{12}$, and $Q_1$ are each independently one selected from the group consisting of a hydrogen atom, a deuterium atom, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_3$-$C_{30}$ heteroaryl group, and a group represented by $-N(Q_2)(Q_3)$;

$Q_2$ and $Q_3$ are each independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, or a substituted or unsubstituted $C_3$-$C_{30}$ heteroaryl group; and a, b, m, and n are each independently an integer of 0 to 10, where n $Ar_1$ groups in $-(Ar_1)_n-$ are the same as or different from each other, m $Ar_{11}$ groups in $-(Ar_{11})_m-$ are the same as or different from each other, a $L_1$ groups in $-(L_1)_n$- are the same as or different from each other, and b $L_{11}$ groups in $-(L_{11})_b$- are the same as or different from each other.

10. The organic light-emitting diode of claim 9, wherein:

each of $Ar_1$ and $Ar_{11}$ is independently one selected from the group consisting of a $C_1$-$C_{10}$ alkylene group, a substituted or unsubstituted phenylene group, a substituted or unsubstituted indenylene group, a substituted or unsubstituted naphthylene group, a substituted or unsubstituted fluorenylene group, a substituted or unsubstituted anthrylene group, a substituted or unsubstituted carbazolylene group, a substituted or unsubstituted pyrazolylene group, a substituted or unsubstituted pyridynylene group, a substituted or unsubstituted triazinylene group, and $-N(Q_1)$-; and $Q_1$ is one selected from the group consisting of a hydrogen atom, a substituted or unsubstituted $C_1$-$C_{10}$ alkyl group, a substituted or unsubstituted $C_1$-$C_{10}$ alkoxy group, a substituted or unsubstituted phenyl group, a substituted or unsubstituted naphthyl group, a substituted or unsubstituted carbazolyl group, and a substituted or unsubstituted fluorenyl group.

11. The organic light-emitting diode of claim 9, wherein:

each of $Ar_2$ and $Ar_{12}$ is independently one selected from the group consisting of a hydrogen atom, a substituted or unsubstituted $C_1$-$C_{10}$ alkyl group, a substituted or unsubstituted phenyl group, a substituted or unsubstituted naphthyl group, a substituted or unsubstituted carbazolyl group, a substituted or unsubstituted fluorenyl group, a substituted or unsubstituted pyrenyl group, and a group represented by $-N(Q_2)(Q_3)$; and each of $Q_2$ and $Q_3$ is independently one selected from the group consisting of a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, and a substituted or unsubstituted methylnaphthyl group.

12. The organic light-emitting diode of claim 9, wherein each of the first hole transporting compound and the second hole transporting compound is independently one of Compounds 101 through 137 below:

Compound 101
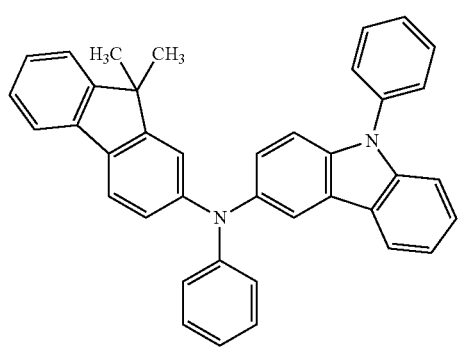
Compound 102
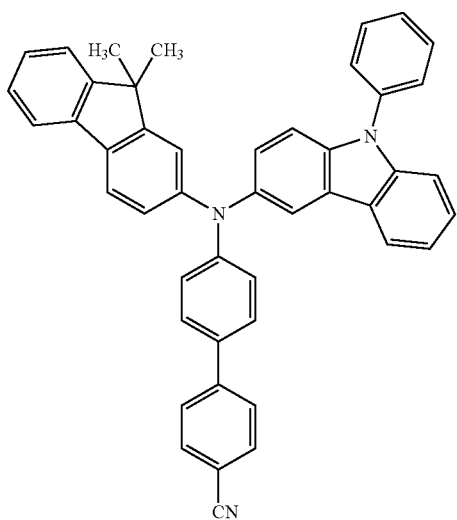
Compound 103
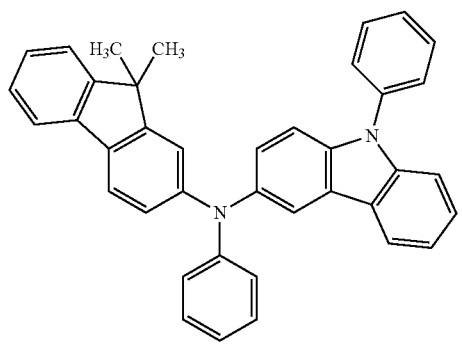
Compound 104
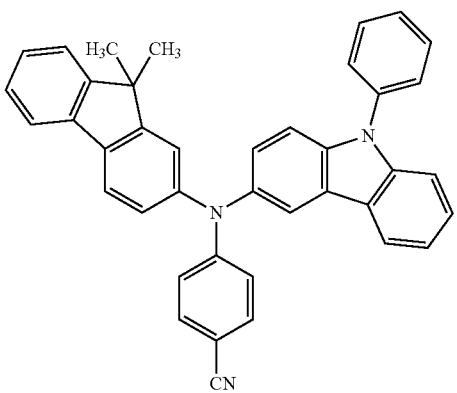
Compound 105
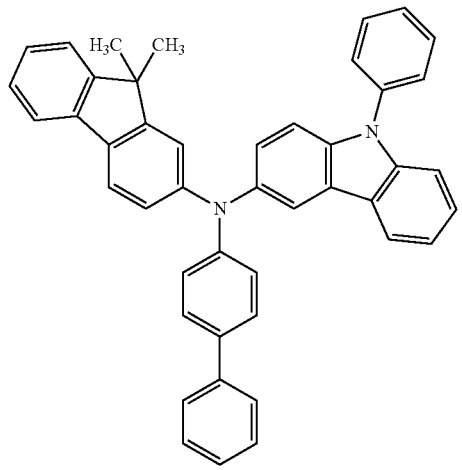
Compound 106
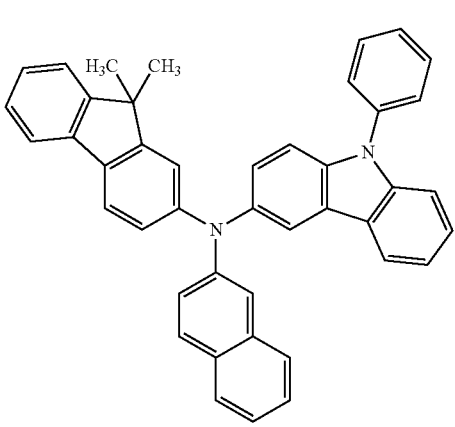

-continued
Compound 107
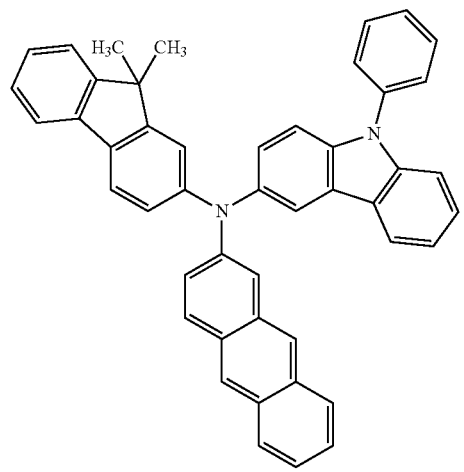
Compound 108
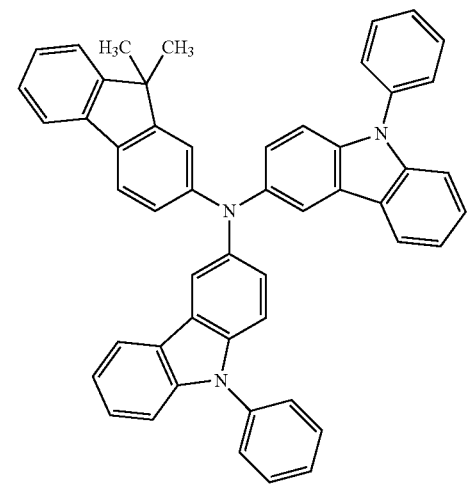
Compound 109
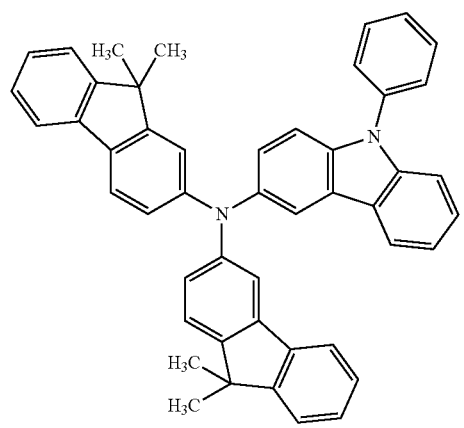
Compound 110
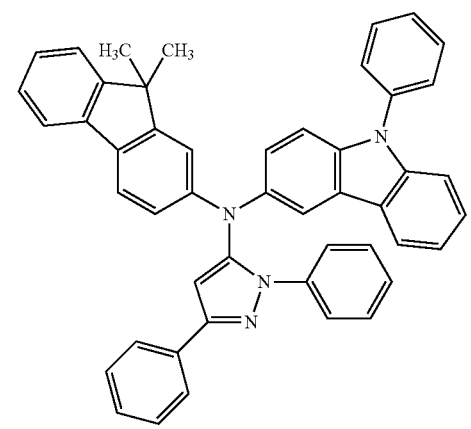
Compound 111
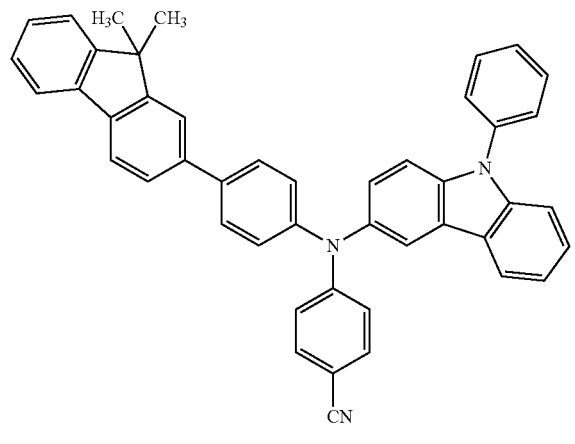
Compound 112
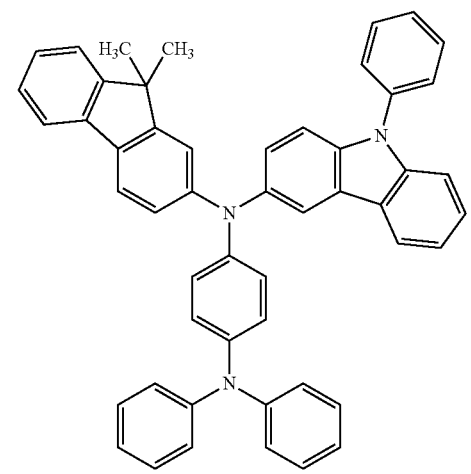

Compound 113
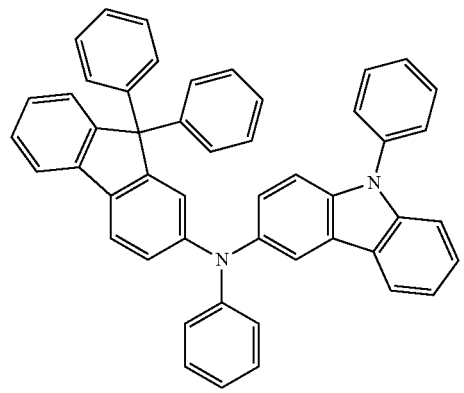
Compound 114
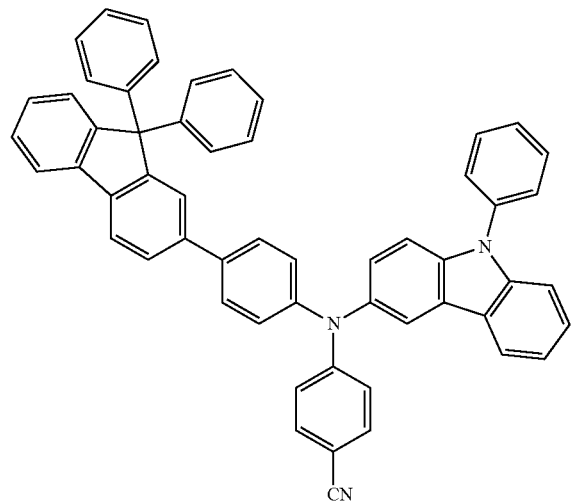
Compound 115
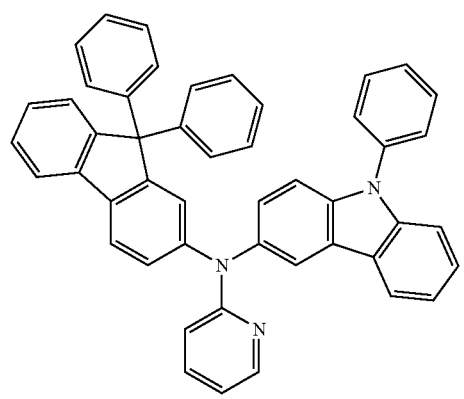
Compound 116
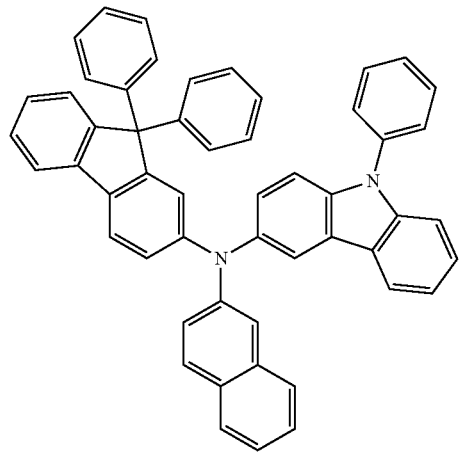
Compound 117
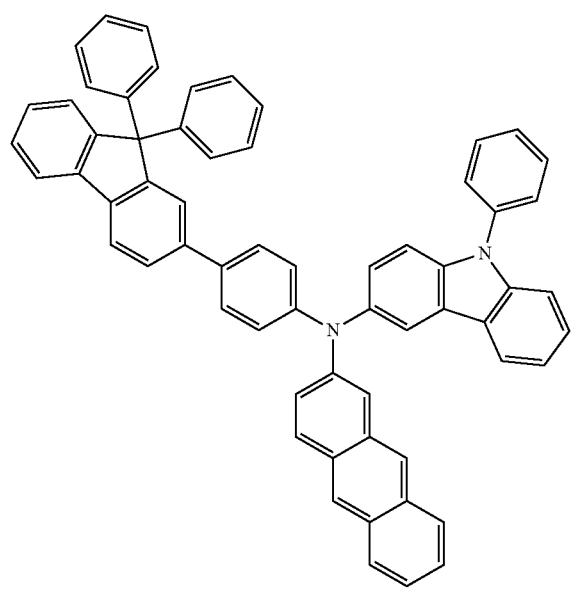
Compound 118
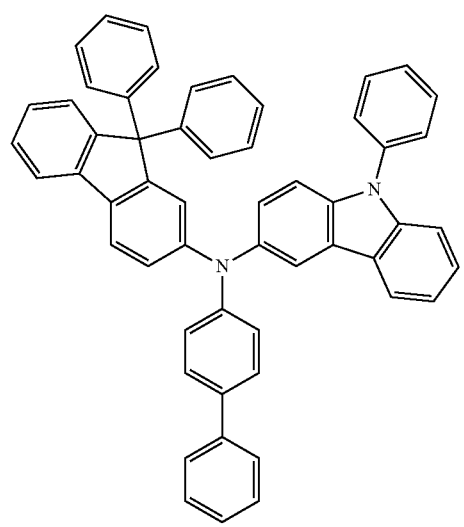

-continued
Compound 119
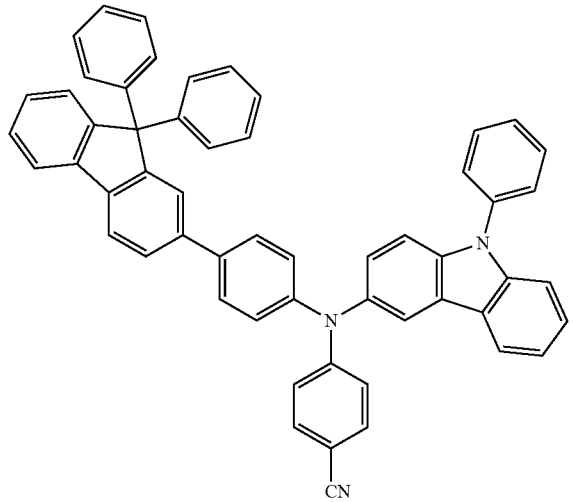
Compound 120
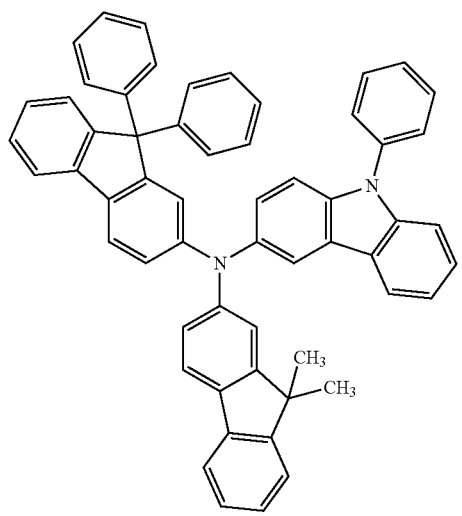
Compound 121
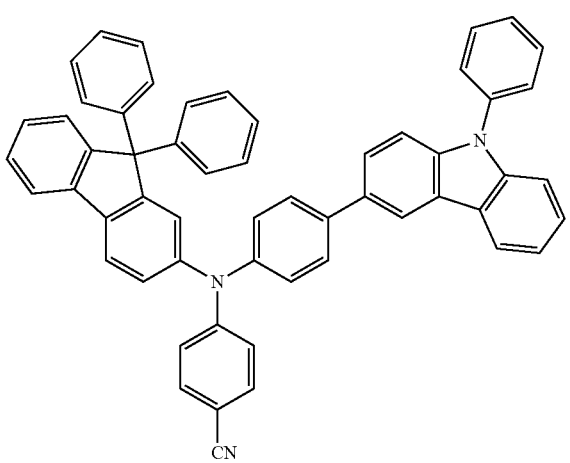
Compound 122
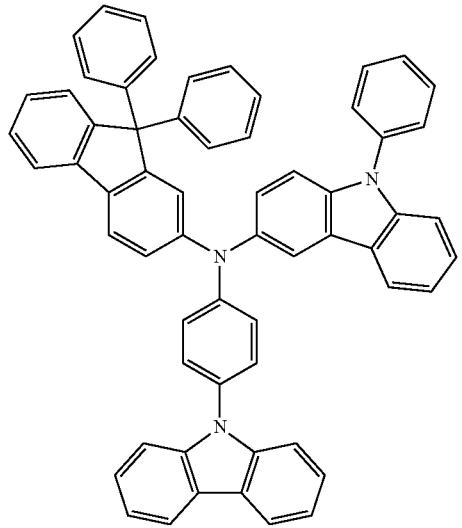
Compound 123
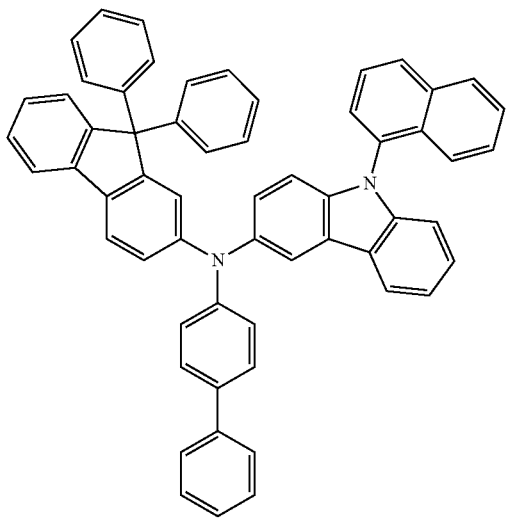

-continued
Compound 124
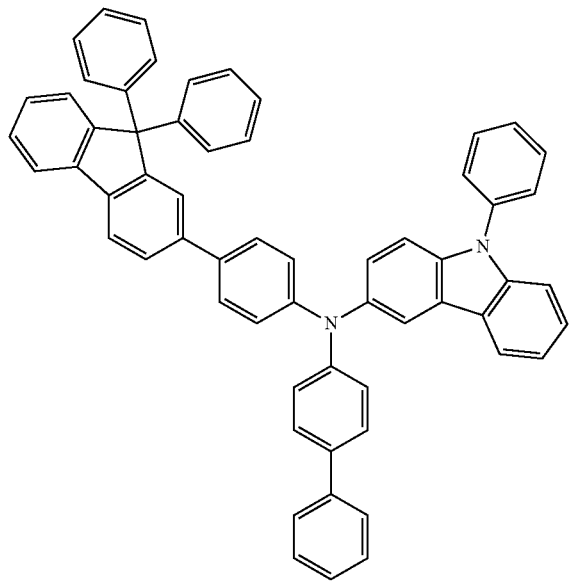
Compound 125
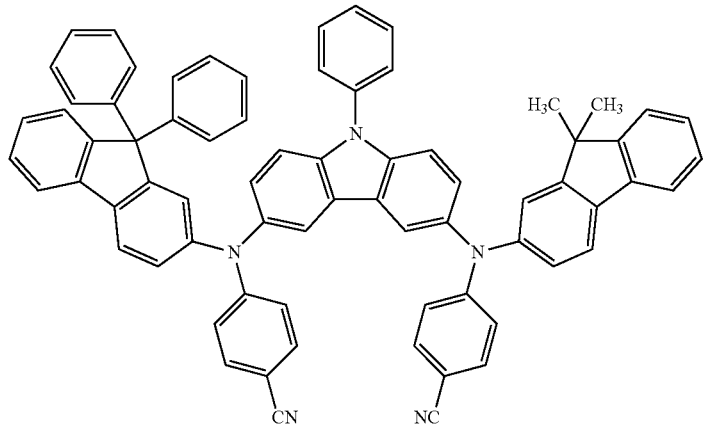
Compound 126
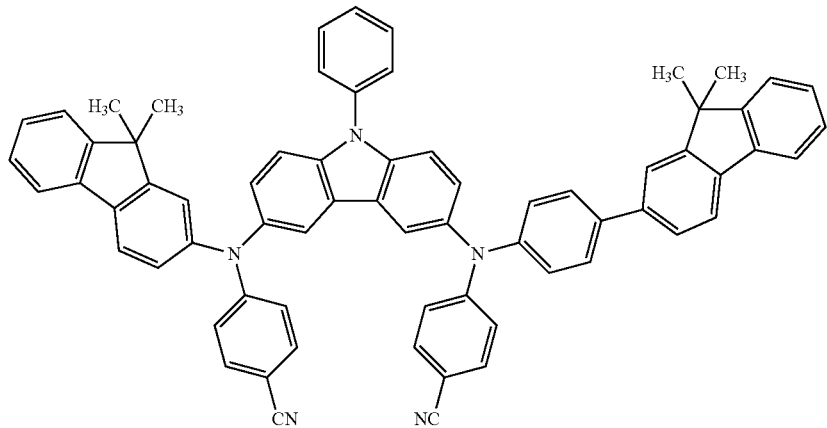

-continued
Compound 127
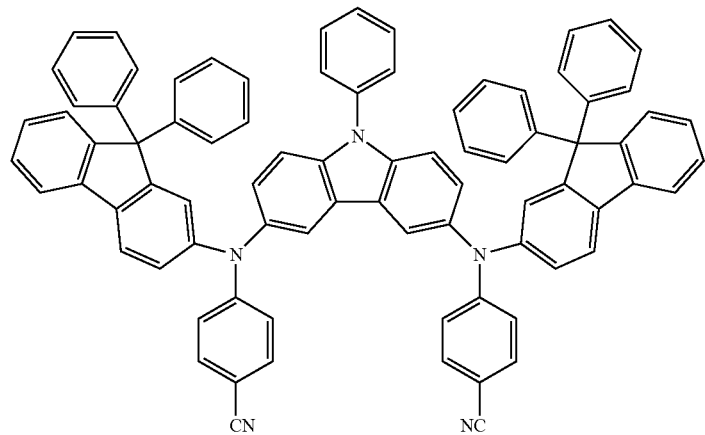
Compound 128
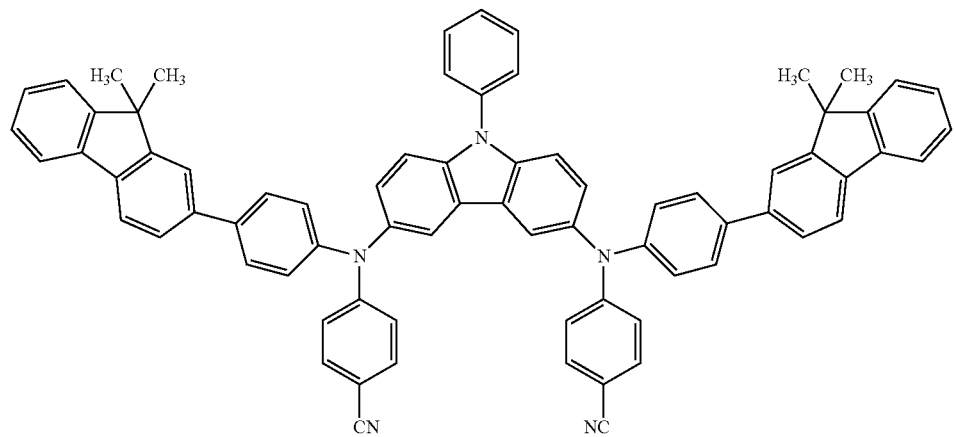
Compound 129
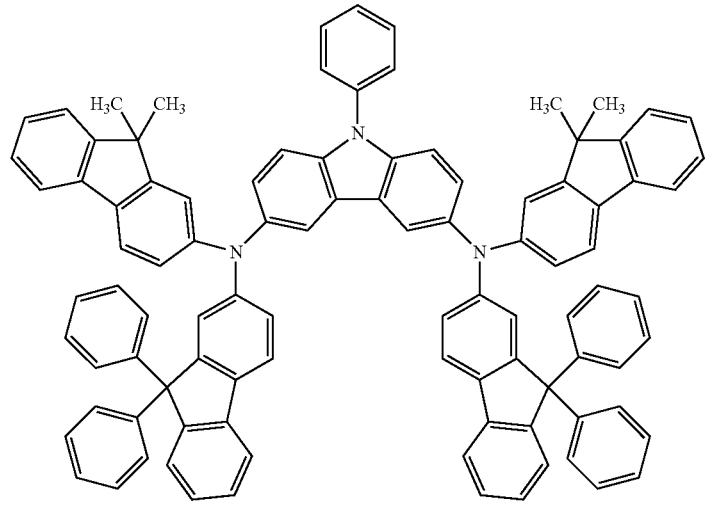

-continued
Compound 130
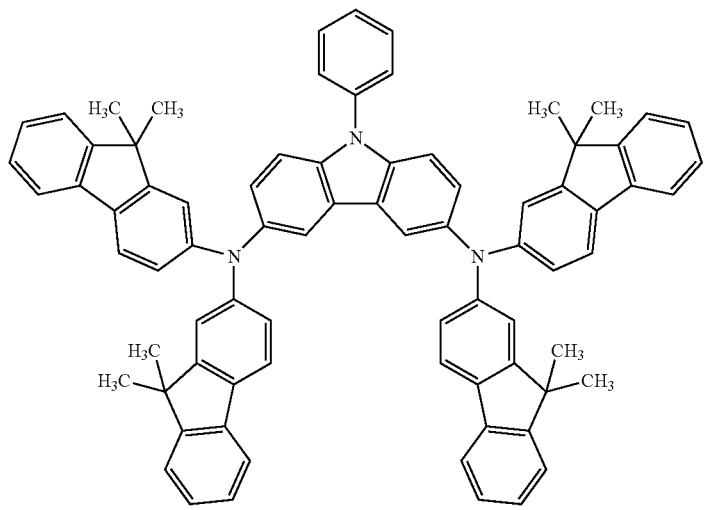
Compound 131
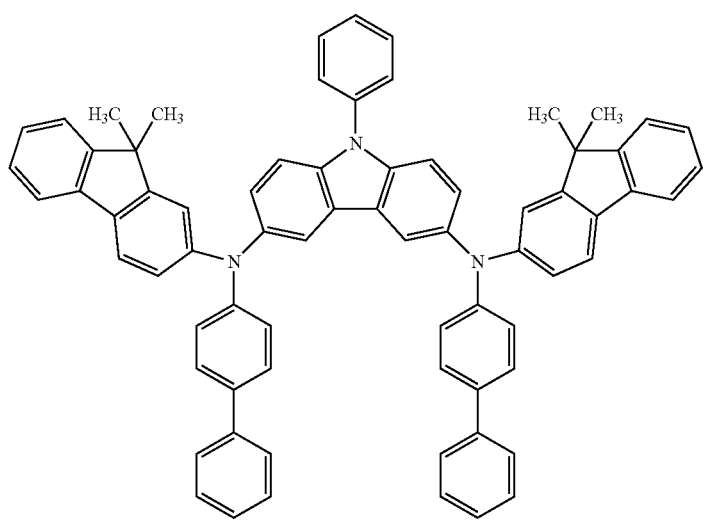
Compound 132
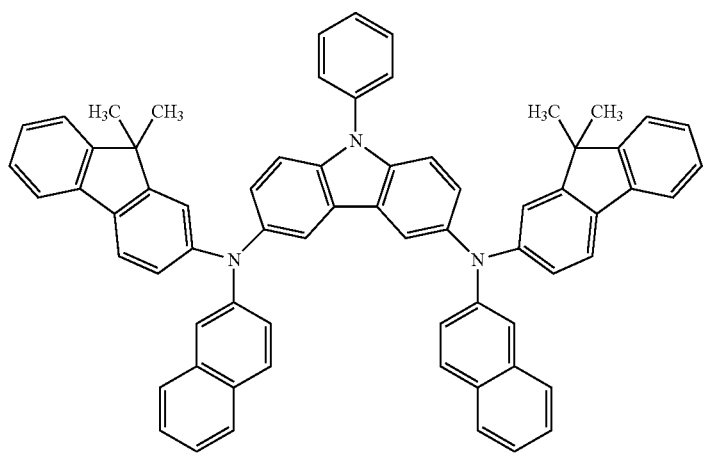

-continued
Compound 133
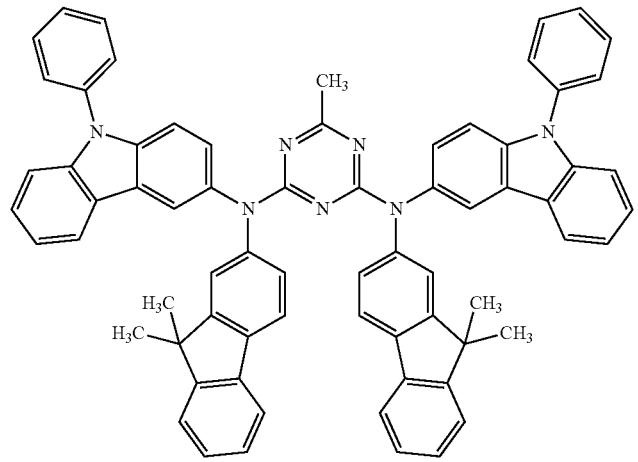
Compound 134
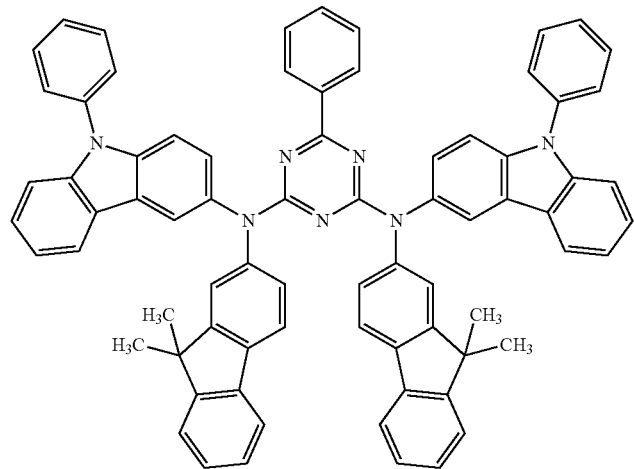
Compound 135
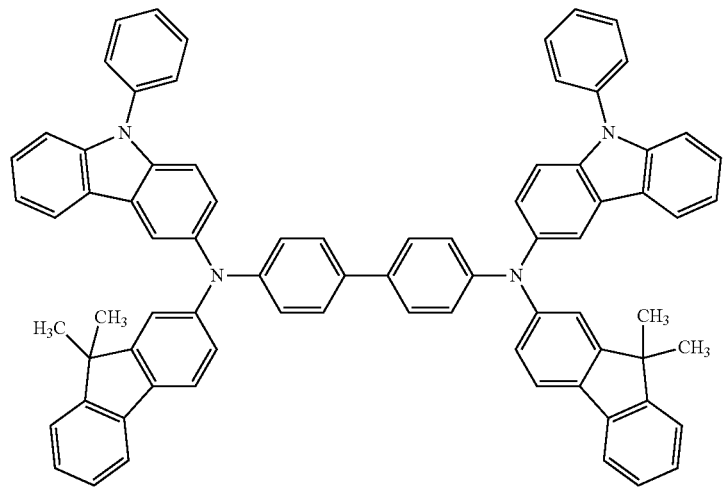

-continued

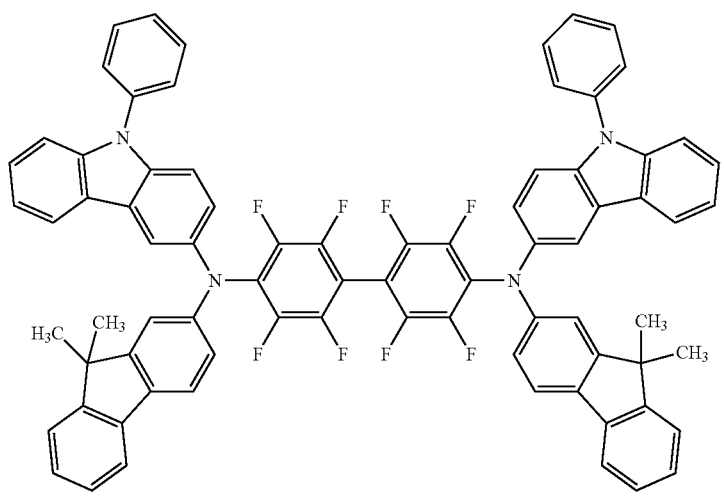

Compound 136

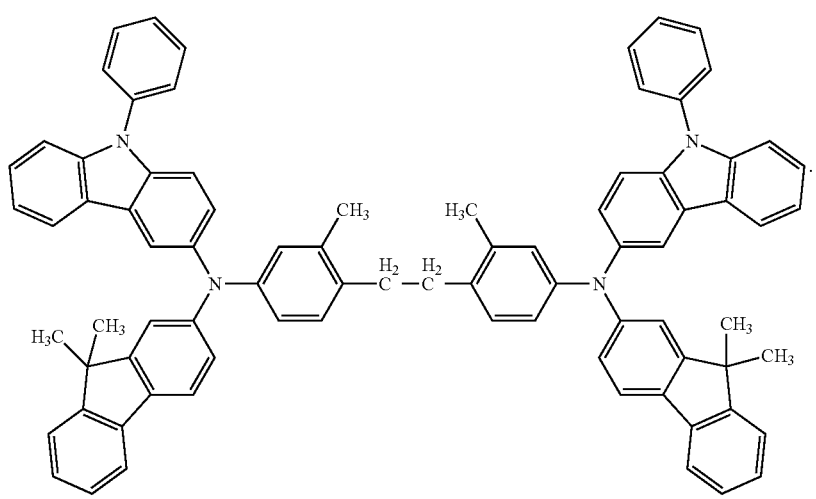

Compound 137

13. The organic light-emitting diode of claim 1, wherein an amount of the first cyano group-containing compound in the first mixing layer is in a range of about 0.5 to about 10 parts by weight based on 100 parts by weight of the first mixing layer, and an amount of the second cyano group-containing compound in the second mixing layer is in the range of about 0.5 to about 10 parts by weight based on 100 parts by weight of the second mixing layer.

14. The organic light-emitting diode of claim 1, wherein a thickness of each of the first mixing layer and the second mixing layer is independently in a range of about 50 to about 200 Å.

15. The organic light-emitting diode of claim 1, wherein the second hole transport layer is interposed between the emission layer and the first hole transport layer and has a higher lowest unoccupied molecular orbital potential than that of the first hole transport layer.

16. The organic light-emitting diode of claim 1, wherein the first mixing layer contacts the first electrode.

17. The organic light-emitting diode of claim 1, further comprising:

a third hole transport layer interposed between the first electrode and the emission layer and comprising a third hole transporting compound; and a third mixing layer interposed between the first electrode and the third hole transport layer, contacting the third hole transport layer and comprising the third hole transporting compound and a third cyano group-containing compound.

18. The organic light-emitting diode of claim 1, further comprising at least one of an electron blocking layer interposed between the emission layer and the second hole transport layer or a hole blocking layer interposed between the emission layer and the electron transport layer.

19. The organic light-emitting diode of claim 1, further comprising a passivation layer on the second electrode.

20. A flat display device comprising:
a transistor comprising a source electrode, a drain electrode, a gate, and an active layer; and
the organic light-emitting diode according to claim 1,
wherein the source electrode or the drain electrode is electrically connected to the first electrode of the organic light-emitting diode.

* * * * *